US011119541B2

(12) United States Patent
Choi et al.

(10) Patent No.: US 11,119,541 B2
(45) Date of Patent: Sep. 14, 2021

(54) PORTABLE ELECTRONIC DEVICE

(71) Applicant: Samsung Electronics Co., Ltd., Suwon-si (KR)

(72) Inventors: Jong-Min Choi, Seongnam-si (KR); Sung-Gun Cho, Yongin-si (KR); Woong-Chan Kim, Suwon-si (KR); Dae-Hyeong Park, Seongnam-si (KR); Sung-Joo Cho, Bucheon-si (KR); Young-Sik Choi, Seoul (KR); Soon-Woong Yang, Yongin-si (KR); Min-Sung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/860,557

(22) Filed: Apr. 28, 2020

(65) Prior Publication Data

US 2020/0257340 A1    Aug. 13, 2020

Related U.S. Application Data

(63) Continuation of application No. 16/387,044, filed on Apr. 17, 2019, now Pat. No. 10,656,681, which is a
(Continued)

(30) Foreign Application Priority Data

Oct. 16, 2015    (KR) .................. 10-2015-0144970

(51) Int. Cl.
*G06F 1/16*    (2006.01)
*H04B 1/3818*    (2015.01)
(Continued)

(52) U.S. Cl.
CPC .......... *G06F 1/1656* (2013.01); *G06F 1/1658* (2013.01); *G06F 1/1675* (2013.01);
(Continued)

(58) Field of Classification Search
CPC ..... G06F 1/1656; G06F 1/1568; G06F 1/1684
See application file for complete search history.

(56) References Cited

U.S. PATENT DOCUMENTS 8,199,464 B2    6/2012  Zuo et al.
8,734,188 B2    5/2014  Nakase et al.
(Continued)

FOREIGN PATENT DOCUMENTS

CN    101364079 A    2/2009
CN    203872233 U    10/2014
(Continued)

OTHER PUBLICATIONS

European Examination Report dated Apr. 2, 2020, issued in European Application No. 16 855 665.2-1203.
(Continued)

*Primary Examiner* — Anthony Q Edwards
(74) *Attorney, Agent, or Firm* — Jefferson IP Law, LLP

(57) ABSTRACT

A portable electronic device is provided. The portable electronic device includes a front glass cover that forms the front of the electronic device, a back cover that forms the back of the electronic device, a bezel that surrounds the space formed between the front and back covers and is formed integrally with, or separately from, the back cover, wherein the bezel has a first opening with a first size and a second opening with a second size smaller than the first size, the second opening being disposed adjacent to the first opening, a display device that is located in the space and has a screen area exposed through the front cover, a tray structure that is inserted into the space through the first opening and is detachably mounted, the tray structure having a recess in which a memory card and/or a subscriber identification module (SIM) card is received, a first member that holds the tray structure when the tray structure is inserted into the space and a second member that allows a first member to
(Continued)

release the tray structure by the press of an external member that is inserted through the second opening, and a waterproof structure that includes a first portion that is movably inserted into the second opening, a first end portion that makes contact with the second member by the press of the external member, and a second end portion that is pressed by the external member.

21 Claims, 20 Drawing Sheets

Related U.S. Application Data continuation of application No. 16/039,845, filed on Jul. 19, 2018, now Pat. No. 10,310,562, which is a continuation of application No. 15/270,449, filed on Sep. 20, 2016, now Pat. No. 10,082,834.

(51) Int. Cl.
*H05K 5/06* (2006.01)
*H04B 1/38* (2015.01)

(52) U.S. Cl.
CPC ............ *H04B 1/3818* (2015.01); *H05K 5/06* (2013.01); *H04B 2001/3894* (2013.01)

(56) References Cited

U.S. PATENT DOCUMENTS

| | | | |
|---|---|---|---|
| 8,747,131 B2 | 6/2014 | Nakase et al. | |
| 8,777,669 B2* | 7/2014 | Hu | H01R 13/641 |
| | | | 439/630 |
| 9,118,140 B2* | 8/2015 | Chang | G06K 19/005 |
| 9,135,944 B2 | 9/2015 | Jenks | |
| 9,270,317 B2 | 2/2016 | Huang et al. | |
| 9,281,610 B2* | 3/2016 | Ejiri | G06K 13/0831 |
| 9,311,571 B2 | 4/2016 | Lei | |
| 9,337,575 B1 | 5/2016 | Chang | |
| 9,627,797 B2* | 4/2017 | Song | H01R 13/5213 |
| 9,875,432 B2 | 1/2018 | Motohashi et al. | |
| 10,491,257 B2* | 11/2019 | Cha | H04B 1/3833 |
| 10,656,681 B2* | 5/2020 | Choi | G06F 1/1656 |
| 2002/0119697 A1* | 8/2002 | Chan | H04M 1/0274 |
| | | | 439/519 |
| 2006/0005211 A1 | 1/2006 | Yamazaki et al. | |
| 2006/0172572 A1 | 8/2006 | Matsukawa et al. | |
| 2008/0092043 A1 | 4/2008 | Trethewey | |
| 2008/0165508 A1 | 7/2008 | Wang et al. | |
| 2009/0040881 A1 | 2/2009 | Hozumi et al. | |
| 2009/0267677 A1 | 10/2009 | Myers et al. | |
| 2011/0090652 A1 | 4/2011 | Wee et al. | |
| 2012/0307451 A1 | 12/2012 | Shukla et al. | |
| 2013/0267106 A1 | 10/2013 | Jenks | |
| 2014/0167365 A1 | 6/2014 | Chu | |
| 2015/0155651 A1* | 6/2015 | Ejiri | H01R 13/5213 |
| | | | 439/521 |
| 2015/0201518 A1* | 7/2015 | Hsu | G06K 13/0831 |
| | | | 361/807 |
| 2015/0270639 A1* | 9/2015 | Yu | H01R 13/5219 |
| | | | 439/271 |
| 2016/0050783 A1* | 2/2016 | Li | G06F 1/1656 |
| | | | 361/679.01 |
| 2016/0093961 A1* | 3/2016 | Stephens | G06F 1/00 |
| | | | 439/64 |
| 2016/0111802 A1* | 4/2016 | Shimotsu | H01R 13/633 |
| | | | 439/159 |
| 2016/0113142 A1 | 4/2016 | Moon et al. | |
| 2016/0359269 A1* | 12/2016 | Motohashi | G06K 13/08 |
| 2017/0070002 A1 | 3/2017 | Do et al. | |
| 2017/0108897 A1* | 4/2017 | Choi | G06F 1/1658 |
| 2017/0135239 A1 | 5/2017 | Hyun et al. | |
| 2017/0223156 A1* | 8/2017 | Stephens | H01R 12/714 |
| 2018/0069330 A1 | 3/2018 | Cheng | |

FOREIGN PATENT DOCUMENTS

| | | |
|---|---|---|
| CN | 204316575 U | 5/2015 |
| CN | 104701666 A | 6/2015 |
| CN | 204374836 U | 6/2015 |
| FR | 2814596 A | 3/2002 |
| JP | 2014-182920 A | 9/2014 |
| JP | 2015-106554 A | 6/2015 |
| KR | 10-1531176 B1 | 7/2015 |
| KR | 10-2016-0012859 A | 2/2016 |
| KR | 10-2016-0045284 A | 4/2016 |

OTHER PUBLICATIONS

Chinese Office Action dated Nov. 5, 2019, issued in Chinese Application No. 201680060114.2.
Exlended European Search Report dated Apr. 14, 2021, issued in European Application No. 20217078.3-1203.

\* cited by examiner

PORTABLE ELECTRONIC DEVICE

CROSS-REFERENCE TO RELATED APPLICATION(S)

This application is a continuation application of prior application Ser. No. 16/387,044 filed on Apr. 17, 2019; which is a continuation application of prior application Ser. No. 16/039,845, filed on Jul. 19, 2018, which issued as U.S. Pat. No. 10,310,562 on Jun. 4, 2019; which is a continuation application of prior application Ser. No. 15/270,449, filed on Sep. 20, 2016, which has issued as U.S. Pat. No. 10,082,834 on Sep. 25, 2018; which was based on and claimed priority under 35 U.S.C. § 119(a) of a Korean patent application number 10-2015-0144970, filed on Oct. 16, 2015 in the Korean Intellectual Property Office, the disclosure of each of which is incorporated by reference herein in its entirety.

TECHNICAL FIELD

The present disclosure relates to an electronic device. More particularly, the present disclosure relates to a portable electronic device having a storage medium received therein.

BACKGROUND

An electronic device refers to a device that performs a specific function corresponding to an installed program, such as an electronic diary, a portable multimedia player, a mobile communication terminal, a tablet personal computer (PC), an image/sound device, a desktop/laptop computer, a navigation unit for a vehicle, etc., as well as home appliances. For example, these electronic devices may output stored information as sounds or images. With the high degree of integration of electronic devices and the common use of high-speed and high-capacity wireless communication, a single mobile communication terminal has a variety of functions these days. For example, an entertainment function (such as a game), a multimedia function (such as reproduction of a music/moving image), a communication and security function for mobile banking or the like, a scheduling function, an electronic wallet function, etc., are integrated in a single electronic device, along with a communication function.

Electronic devices (such as an electronic diary, a portable multimedia player, a mobile communication terminal, a tablet PC, etc.) that are used while being carried are generally equipped with a display device and a battery and have an external appearance of a bar type, a folder type, or a sliding type. In recent years, electronic devices that can be worn on a part of a human body (such as a wrist or head) have been commercialized with the compactness of electronic devices thanks to the development of electronic communication technologies. Further, an electronic device in which the case or a part (outer periphery) of the case is formed of a metal material and an electronic device in which the battery is embedded without detachment have emerged according to the preference of users who value the design of an electronic device.

These electronic devices may perform security functions (such as user authentication, etc.), or may expand the storage capacities thereof, using storage mediums, such as subscriber identification module (SIM) cards, memory cards, etc. The electronic devices may have sockets installed therein such that the storage mediums are attached to, and detached from, the electronic devices, and the storage mediums may be inserted into the electronic devices while being mounted on tray structures according to the structures of the electronic devices.

The above information is presented as background information only to assist with an understanding of the present disclosure. No determination has been made, and no assertion is made, as to whether any of the above might be applicable as prior art with regard to the present disclosure.

SUMMARY

When a hole for extracting a tray structure from an electronic device is formed in the electronic device, foreign substances (such as water, dust, etc.) may be introduced into the electronic device from the outside through the hole.

Aspects of the present disclosure are to address at least the above-mentioned problems and/or disadvantages and to provide at least the advantages described below. Accordingly, an aspect of the present disclosure is to provide an electronic device having a waterproof/anti-vibration structure that is capable of preventing foreign substances from being introduced through a hole formed in the electronic device.

In accordance with an aspect of the present disclosure, a portable electronic device is provided. The portable electronic device includes a front glass cover forming a front of the electronic device, a back cover forming a back of the electronic device, a bezel surrounding the space formed between the front and back covers and formed integrally with, or separately from, the back cover, wherein the bezel has a first opening with a first size and a second opening with a second size smaller than the first size, the second opening being disposed adjacent to the first opening, a display device located in the space and including a screen area exposed through the front cover, a tray structure inserted into the space through the first opening and detachably mounted, the tray structure having a recess in which at least one of a memory card and/or a subscriber identification module (SIM) card is received, a first member holding the tray structure when the tray structure is inserted into the space, a second member enabling the first member to release the tray structure by the press of an external member that is inserted through the second opening, and a waterproof structure including a first portion that is movably inserted into the second opening, a first end portion contacting the second member by a press of the external member, and a second end portion pressed by the external member.

The portable electronic device, according to various embodiments of the present disclosure, may include the sealing member sealing a part of the second opening, thereby preventing foreign substances from being introduced into the bezel through the second opening. In addition, the waterproof structure may move in the second opening under the action of an external force to transmit the external force to the tray structure so that the tray structure may be extracted from the bezel.

In accordance with another aspect of the present disclosure, a portable electronic device is provided. The portable electronic device includes a housing having including a first opening, a first member accommodated in the housing, a tray structure that receives receiving a storage medium and is detachably coupled to the first member through the first opening, a second opening formed adjacent to the first opening, and a waterproof structure that moves moving in the second opening along the a longitudinal direction of the second opening and seals sealing a part of the second opening, wherein the tray structure is extracted from the housing by the waterproof structure that moves in the second opening.

In accordance with another aspect of the present disclosure, a portable electronic device is provided. The portable electronic device includes a housing having including a first opening, a first member accommodated in the housing, a tray structure that receives receiving a storage medium and is detachably coupled to the first member through the first opening, a second opening that is formed in the housing and provides providing a passage through which an operation is performed such that to extract the tray structure is extracted from the housing, a pin, at least a part of which is accommodated in the second opening, and a waterproof structure that is provided on the an inner wall of the second opening, or is provided adjacent to the inner wall of the second opening, and is brought close to the pin.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
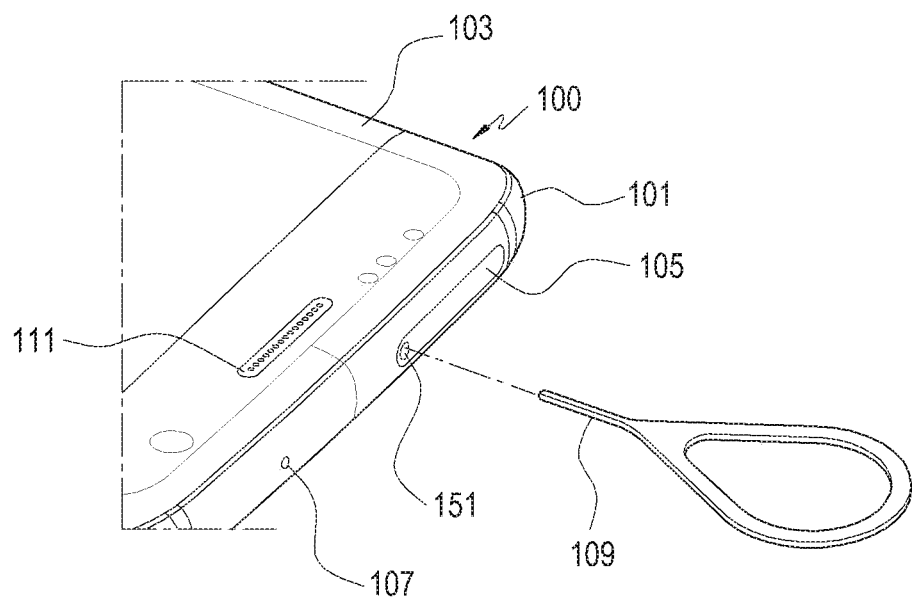
FIG. 1 is a perspective view illustrating an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the present disclosure, the expression "A or B", "at least one of A or/and B", or "one or more of A or/and B" may include all possible combinations of the items listed. The expression "a first", "a second", "the first", or "the second" used in various embodiments of the present disclosure may modify various components regardless of the order and/or the importance but does not limit the corresponding components. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the present disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 (MPEG-1) audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television (TV), a digital versatile disc (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to various embodiments of the present disclosure is not limited to the above described devices. As used herein, the term "user" may indicate a person who uses an electronic device or a device (e.g., an artificial intelligence electronic device) that uses an electronic device.

Figure 2:
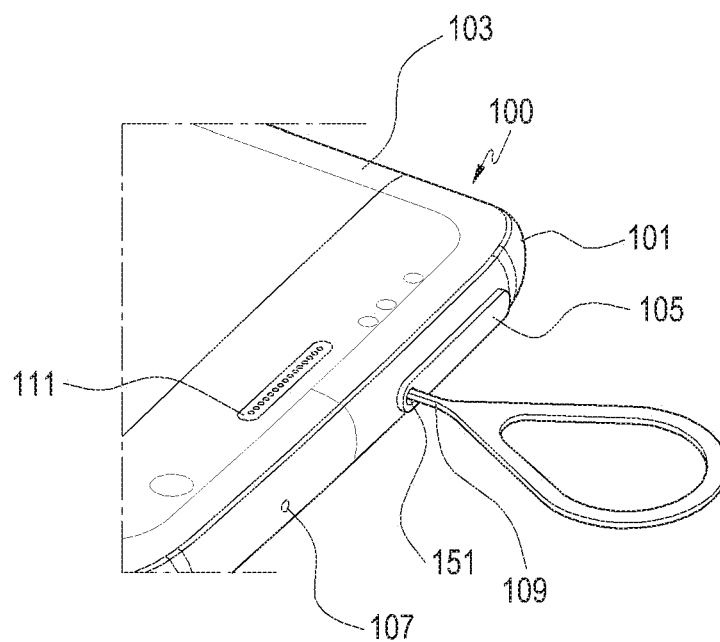
FIG. 2 is a perspective view illustrating a state in which a tray structure is extracted to the outside with an external member inserted into a second opening of the electronic device illustrated in FIG. 1 according to an embodiment of the present disclosure.

FIG. 1 is a perspective view illustrating an electronic device according to an embodiment of the present disclosure. FIG. 2 is a perspective view illustrating a state in which a tray structure is extracted to the outside with an external member inserted into a second opening of the electronic device illustrated in FIG. 1 according to an embodiment of the present disclosure.

Referring to FIGS. 1 and 2, the electronic device 100, according to the embodiment of the present disclosure, may include: a front glass cover 103 that forms the front of the electronic device 100; a back cover that forms the back of the electronic device; and a bezel 101 that surrounds the space formed between the front glass cover 103 and the back cover.

The front glass cover 103 may be formed of a glass material. Without being limited thereto, however, the front glass cover 103 may be formed of various transparent materials, such as reinforced plastics.

The bezel 101 may be formed integrally with, or separately from, the back cover. The bezel 101 may include a first opening with a first size and the second opening that is smaller than the first opening. The second opening may be located adjacent to the first opening. The bezel 101 may be formed of a plastic material, which may be, for example, polycarbonate. Without being limited thereto, however, the bezel 101 may be formed of various types of plastic materials. Alternatively, the bezel 101 and the back cover may be formed of a metal material. In another case, the bezel 101 may be formed of a metal material, and the back cover may be formed of a plastic material according to various embodiments of the present disclosure. The bezel 101 formed of a metal material may be used as an antenna radiator of the electronic device 100. Further, a circuit board may be provided in the space. A controller, a communication circuit unit, and the like that are necessary for driving the electronic device 100 and various types of connection terminals that are connected with an earphone jack and a universal serial bus (USB) connector may be mounted on the circuit board. Various input/output devices (such as a keypad, a call receiving part 111, a microphone hole 107, etc.), various sensors (such as an ambient light sensor, etc.), and a camera may be mounted on the bezel 101.

Further, the electronic device 100, according to various embodiments of the present disclosure, may include a display device and the tray structure 105.

The display device may be accommodated in the space and may include a display area that is exposed through the front glass cover 103. The display device may be provided on the back of the front glass cover 103 and may include a touch panel. The front glass cover 103 may transmit a screen that is output through the display device. The front glass cover may be integrally formed with the touch panel to provide the function of an input device. Further, one surface of the front glass cover 103 may be a curved surface. For example, the opposite lateral surfaces of the front glass cover 103 may be curved so that images, icons, or the like may be displayed through the opposite lateral surfaces of the front glass cover 103, as well as through the front thereof.

The tray structure 105 may include a recess in which a storage medium is received, and may be detachably coupled to one surface (for example, the upper surface) of the bezel 101. The storage medium S may include a memory card (such as a secure digital (SD) card, a micro SD card, etc.) or a subscriber identification module (SIM) card. The outer surface of the tray structure 105 may be a flat or curved surface that corresponds to one surface of the bezel 101, and may form, together with the bezel 101, an external appearance that is integrated with the exterior of the electronic device 100. Further, the tray structure 105 may have a tray hole 151 formed in the outer surface thereof, which corresponds to the second opening of the bezel 101, which will be described below, and is used to extract the tray structure 105.

In order to extract the tray structure 105, which is mounted in the bezel 101, from the bezel 101, the external member 109 may be inserted into the tray hole 151. The external member 109 may have a rod shape that corresponds to the tray hole 151, and may include a grip portion that a user may grip. Without being limited thereto, however, the external member 109 may have a variety of structures that may be inserted into the second opening, such as a clip, a pen, an electronic pen mounted in the electronic device, a switch installed in the second opening, etc. As illustrated in FIG. 2, when the external member 109 applies a force while being inserted into the tray hole 151, the tray structure 105 may be extracted from the bezel 101 while being separated from the bezel 101.

Figure 3:
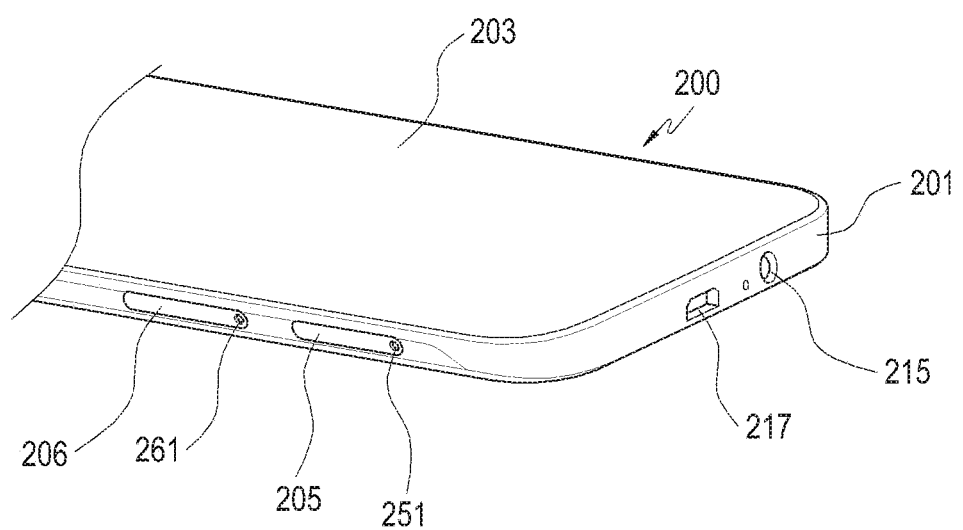
FIG. 3 is a perspective view illustrating an electronic device according to an embodiment of the present disclosure.

FIG. 3 is a perspective view illustrating an electronic device according to an embodiment of the present disclosure. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

Referring to FIG. 3, the electronic device 200, according to the embodiment of the present disclosure, may include a bezel 201, a display device 203, and tray structures 205 and 206.

The bezel 201 may have first and second connection terminals 215 and 217 on the top side thereof, in which the first connection terminal 215 may be connected with an earphone jack, and the second connection terminal 217 may be connected with a USB terminal.

The display device 203 may form the front of the bezel 201 and may have a flat shape.

The tray structures 205 and 206 may be mounted on a lateral side of the bezel 201. The tray structures 205 and 206 may be disposed adjacent to each other. The tray structures 205 and 206 may be mounted in the bezel 201 with different storage mediums received therein. For example, the tray structures 205 and 206 may include the first tray structure 205 that receives a memory card and the second tray structure 206 that receives a SIM card. In contrast, the first tray structure 205 may receive a SIM card, and the second tray structure 206 may receive a memory card. Alternatively, each of the first and second tray structures 205 and 206 may have a structure equipped with both a memory card and a SIM card. In another case, a SIM card may include a first SIM card and a second SIM card, and the first tray structure 205 and the second tray structure 206 may be provided with the first SIM card and the second SIM card, respectively. The first tray structure 205 may have a first tray hole 251 formed therein, and the second tray structure 206 may have a second tray hole 261 formed therein. The first tray hole 251 has the same inner diameter as that of the second tray hole 261 so that one external member may be inserted into the first or second tray holes 251 or 261 to extract the first or second tray structure 205 or 206 from the bezel 201.

Figure 4:
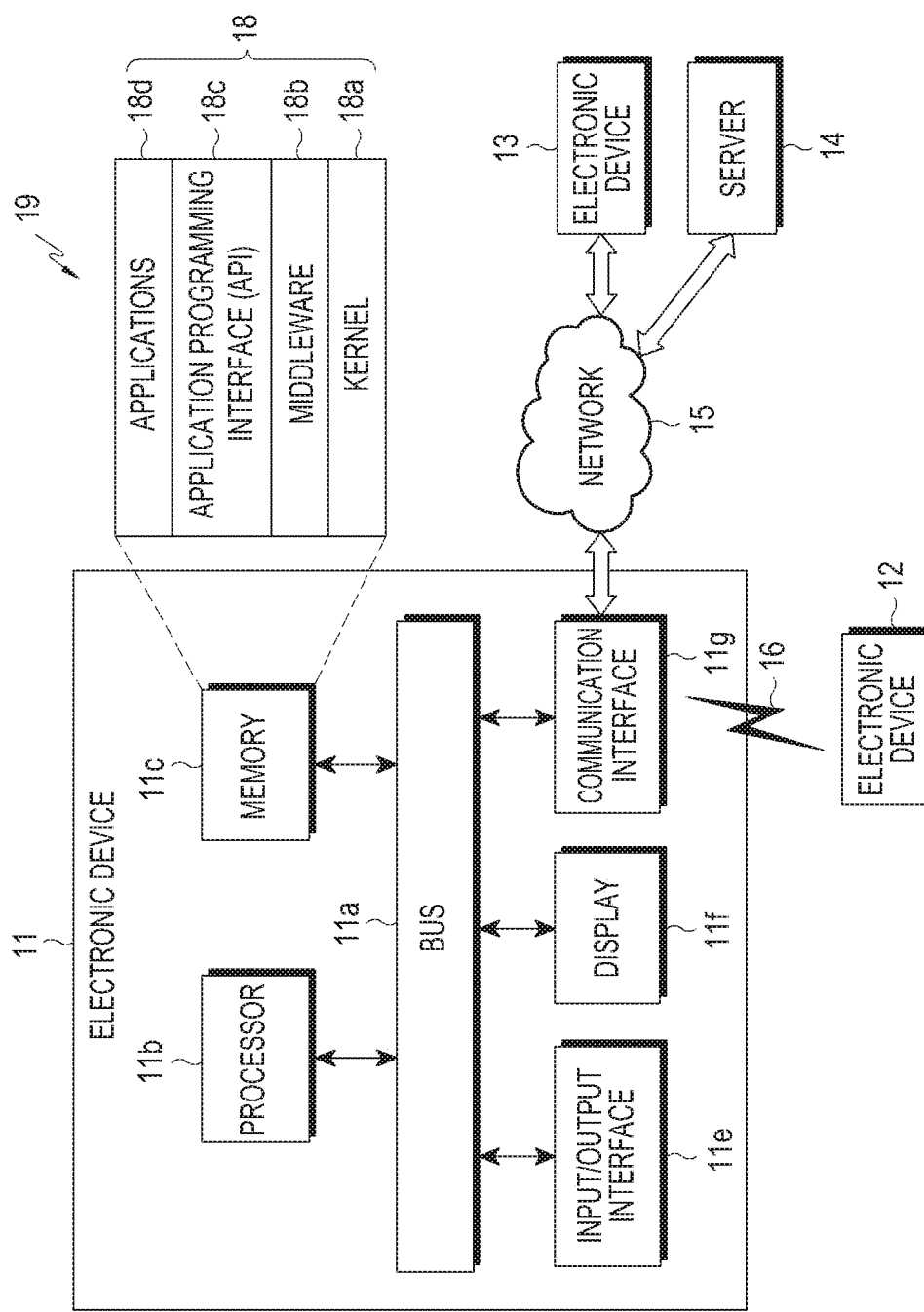
FIG. 4 is a diagram illustrating a network environment that includes an electronic device according to an embodiment of the present disclosure.

FIG. 4 is a diagram illustrating a network environment that includes an electronic device according to an embodiment of the present disclosure.

Referring to FIG. 4, an electronic device 11 (e.g., the above-described electronic devices 100 and 200) within the network environment 19, according to various embodiments, will be described. The electronic device 11 may include a bus 11a, a processor 11b, a memory 11c, an input/output interface 11e, a display 11f, and a communication interface 11g. In some embodiments, the electronic device 11 may omit at least one of the elements 11a to 11g, or may further include other elements. The bus 11a may include, for example, a circuit that mutually connects the elements 11b to 11g and transmits communication (e.g., control messages and/or data) between the elements. The processor 11b may include one or more of a central processing unit, an AP, and a communication processor (CP). The processor 11b may carry out operations or data processing relating to the control and/or communication of at least one other element of the electronic device 11.

The memory 11c may include a volatile memory and/or a non-volatile memory. The memory 11c may store, for example, instructions or data relating to at least one other element of the electronic device 11. According to an embodiment, the memory 11c may store software and/or a program 18. The memory 11c may include, for example, an internal memory and an external memory. The internal memory may include, for example, at least one of a volatile memory (e.g., a dynamic random access memory (DRAM), a static RAM (SRAM), a synchronous DRAM (SDRAM), etc.) and a non-volatile memory (e.g., a one time programmable read only memory (OTPROM), a PROM, an erasable PROM (EPROM), an electrically erasable PROM (EEPROM), a mask ROM, a flash ROM, a flash memory, a hard disk drive, or a solid state drive (SSD)). The external memory may include a flash drive, for example, a compact flash (CF), an SD, a micro-SD, a mini-SD, an extreme digital (xD), a multi-media card (MMC), a memory stick, etc. The external memory may be functionally and/or physically connected with the electronic device 11 through various interfaces. The program 18 may include, for example, a kernel 18a, middleware 18b, an application programming interface (API) 18c, and/or application programs (or "applications") 18d. At least some of the kernel 18a, the middleware 18b, and the API 18c may be referred to as an operating system. The kernel 18a may control or manage, for example, the system resources (e.g., the bus 11a, the processor 11b, the memory 11c, etc.) that are used to perform operations or functions that are implemented in the other programs (e.g., the middleware 18b, the API 18c, and the application programs 18d). Furthermore, the kernel 18a may provide an interface by which the middleware 18b, the API 18c, or the application programs 18d may access the individual elements of the electronic device 11 to control or manage the system resources.

The middleware 18b may function as, for example, an intermediary that allows the API 18c or the application programs 18d to communicate with the kernel 18a to exchange data. Furthermore, the middleware 18b may process one or more task requests, which are received from the application programs 18d, according to the priorities thereof. For example, the middleware 18b may assign a priority for using the system resources (e.g., the bus 11a, the processor 11b, the memory 11c, etc.) of the electronic device 11 to at least one of the application programs 18d, and may process the one or more task requests. The API 18c is an interface used by the application programs 18d to control functions provided from the kernel 18a or the middleware 18b, and may include, for example, at least one interface or function (e.g., instruction) for file control, window control, image processing, text control, etc. The input/output interface 11e may, for example, forward instructions or data, which is input from a user or an external device, to the other element(s) of the electronic device 11, or may output instructions or data, which is received from the other element(s) of the electronic device 11, to the user or the external device.

Examples of the display 11f may include a liquid crystal display (LCD), a light emitting diode (LED) display, an organic LED (OLED) display, a micro electro mechanical system (MEMS) display, and an electronic paper display. The display 11f may display, for example, various types of content (e.g., texts, images, videos, icons, symbols, etc.) for a user. The display 11f may include a touch screen, and may receive, for example, a touch, gesture, proximity, or hovering input using an electronic pen or a user's body part. The communication interface 11g may set, for example, communication between the electronic device 11 and an external device (e.g., a first external electronic device 12, a second external electronic device 13, or a server 14). For example, the communication interface 11g may be connected to a network 15 through wireless or wired communication to communicate with the external device (e.g., the second external electronic device 13 or the server 14).

The wireless communication may include, for example, at least one of long term evolution (LTE), LTE-advanced (LTE-A), code division multiple access (CDMA), wideband CDMA (WCDMA), universal mobile telecommunications system (UMTS), wireless broadband (WiBro), global system for mobile communications (GSM), etc. According to an embodiment, the wireless communication may include, for example, at least one of Wireless Fidelity (Wi-Fi), Bluetooth (BT), Bluetooth low energy (BLE), ZigBee, near field communication (NFC), magnetic secure transmission, radio frequency (RF), and body area network (BAN). According to an embodiment, the wireless communication may include global navigation satellite system (GNSS). The GNSS may be, for example, a GPS, a global navigation satellite system (GLONASS), a BeiDou navigation satellite system (hereinafter, referred to as "BeiDou"), or Galileo (the European global satellite-based navigation system). Hereinafter, the term "GPS" may be interchangeably used with the term "GNSS" in various embodiments. The wired communication may include, for example, at least one of a USB, a high definition multimedia interface (HDMI), recommended standard 232 (RS-232), power line communication, a plain old telephone service (POTS), etc. The network 15 may include a telecommunication network, which may be, for example, at least one of a computer network (e.g., a local area network (LAN) or a wide area network (WAN)), the internet, and a telephone network.

Each of the first and second external electronic devices 12 and 13 may be the same type of device as, or a different type of device from, the electronic device 11. According to various embodiments, all or some of the operations executed in the electronic device 11 may be carried out in another electronic device or in a plurality of electronic devices (e.g., the external electronic devices 12 and 13 or the server 14). According to an embodiment, when the electronic device 11 has to perform some functions or services automatically or in response to a request, the electronic device 11 may request another device (e.g., the external electronic devices 12 or 13 or the server 14) to perform at least some functions relating thereto instead of, or in addition to, performing the functions or services by itself. The other electronic device (e.g., the external electronic devices 12 or 13 or the server 14) may perform the requested functions or the additional functions, and may send the execution result to the electronic device 11. The electronic device 11 may provide the received result as it is, or may additionally process the received result to provide the requested functions or services. To this end, for example, cloud computing, distributed computing, or client-server computing technology may be used.

Figure 5:
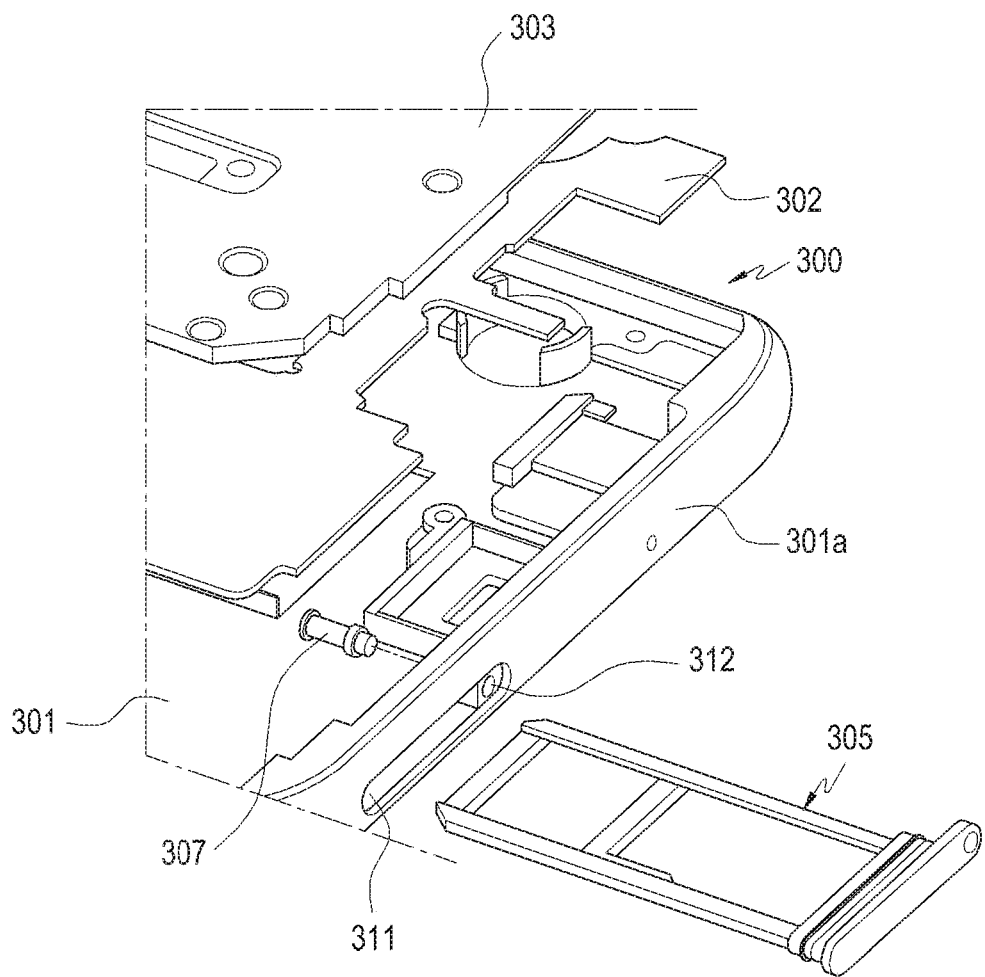
FIG. 5 is an exploded perspective view illustrating an electronic device according to an embodiment of the present disclosure.
Figure 6:
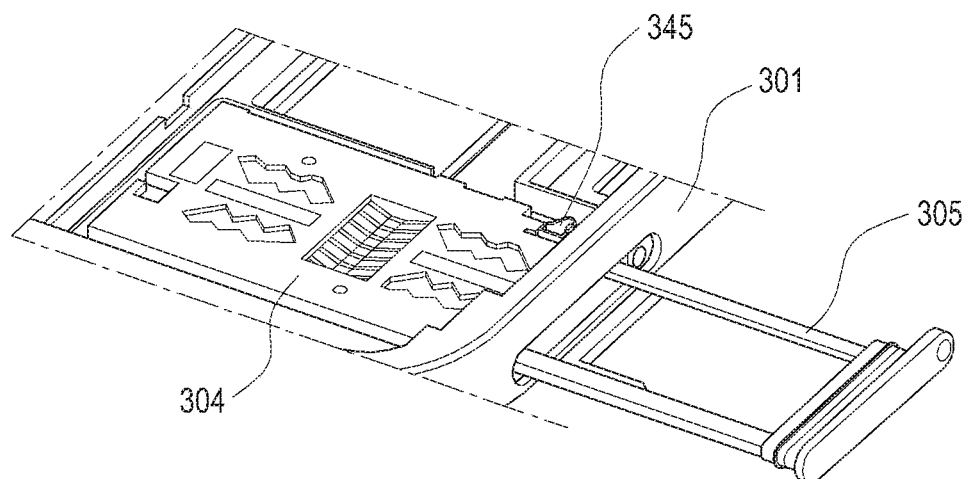
FIG. 6 is a perspective view illustrating a state in which a tray structure of the electronic device illustrated in FIG. 5 is separated from a first member according to an embodiment of the present disclosure.
Figure 7:
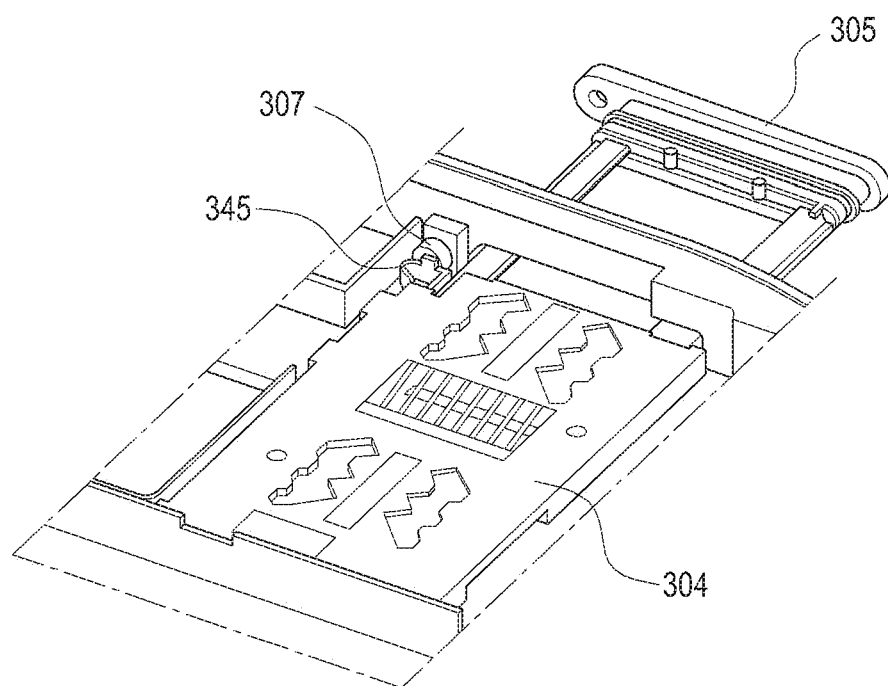
FIG. 7 is a perspective view illustrating a state in which the tray structure of the electronic device illustrated in FIG. 5 is mounted in the first member according to an embodiment of the present disclosure.

FIG. 5 is an exploded perspective view illustrating an electronic device according to an embodiment of the present disclosure. FIG. 6 is a perspective view illustrating a state in which a tray structure of the electronic device illustrated in FIG. 5 is separated from a first member according to an embodiment of the present disclosure. FIG. 7 is a perspective view illustrating a state in which the tray structure of the electronic device illustrated in FIG. 5 is mounted in the first member according to an embodiment of the present disclosure. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

Referring to FIGS. 5 to 7, the electronic device 300, according to the embodiment of the present disclosure, may include a housing 301, a circuit board 302, a support part (or a back cover or a front cover) 303, the tray structure 305, and a sealing member 307.

The housing 301 may provide the mechanical rigidity of the electronic device while forming the exterior of the electronic device together with a bezel 301a and the back cover.

The circuit board 302 may be accommodated in the housing 301, and may have electronic components mounted thereon, such as integrated circuit chips (e.g., an AP, a communication module, a memory, an audio module, a power management module, etc.), a socket for a storage medium, various types of sensors and connectors, an antenna device, a connector for connection with an external device, etc.

The support part 303 may be accommodated in the housing 301 and may be coupled to the inner surface of the housing 301 through a bolt coupling method. The support part 303 may enhance the mechanical rigidity of the housing 301 and may protect and isolate various types of electronic components within the housing 301 from each other. For example, since various types of electronic components, such as integrated circuit chips, etc., are mounted on the circuit board 302, the display device (not illustrated) provided on the front of the housing 301 may be damaged when the display device makes contact with the electronic components. The support part 303 may be disposed between the circuit board 302 and the display device to prevent the electronic components from making direct contact with the display device. Further, the support part 303 may shield electromagnetic waves that are generated when the electronic components operate in order to prevent the electromagnetic waves from affecting the operations of other electronic components. For example, since the support part 303 is disposed between the circuit board 302 and the display device, the display device may stably operate without being affected by electromagnetic waves of the other electronic components. In addition, the support part 303 may provide various types of structures that are capable of mounting and fixing the circuit board 302, and may support the display device to stably maintain the shape of the display device. According to various embodiments of the present disclosure, the support part 303 may correspond to the back cover. The support part 303 may form the external appearance of the electronic device together with the bezel 301a. Alternatively, according to various embodiments of the present disclosure, the support part 303 may correspond to the front cover.

The bezel 301a may have a first opening 311 formed in the outer surface thereof, and the tray structure 305 may be inserted into the bezel 301a through the first opening 311. Further, the bezel 301a may have a second opening 312 that is formed adjacent to the first opening 311. The external member 109 (illustrated in FIG. 1) may be inserted into the second opening 312.

The sealing member 307 may be inserted into the second opening 312 to seal a part of the second opening 312. A detailed description of the sealing member 307 will be given below with reference to the accompanying drawings.

The first member 304 may be provided between the inner surface of the housing 301 and the circuit board 302 and may be mounted on the circuit board 302. The first member 304 may be electrically connected with a storage medium received in the tray structure 305. The first member 304 may be equipped with a second member 345 for separating the tray structure 305 mounted in the first member 304 from the first member 304. The second member 345 may be provided adjacent to the inner surface of the first member 304 and may move along the longitudinal direction of the second member 345. However, without being limited thereto, the second member 345 may be provided adjacent to the outer surface of the first member 304. The sealing member 307 may make contact with one end of the second member 345, and may transmit force to the second member 345 to move the second member 345 along the longitudinal direction of the second member 345.

Figure 8:
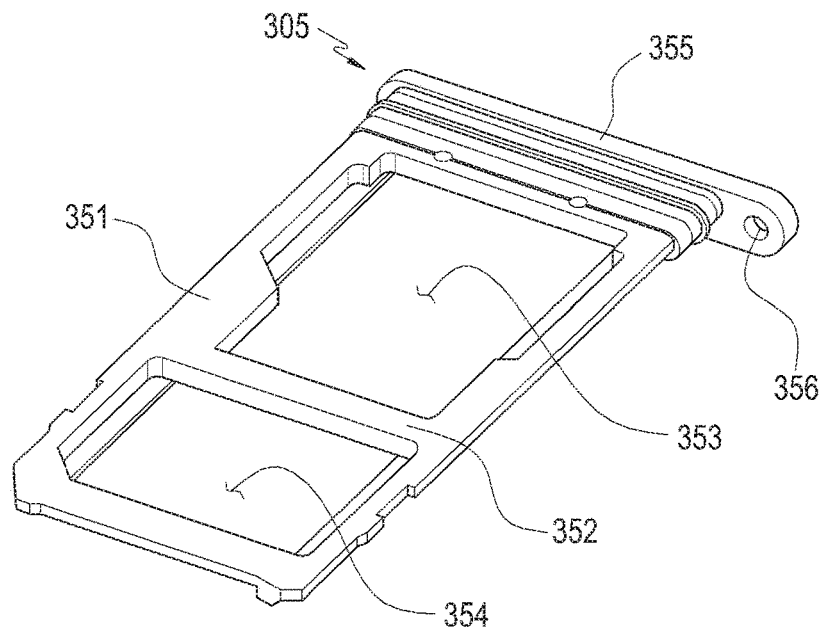
FIG. 8 is a perspective view of the tray structure of the electronic device illustrated in FIG. 5 according to an embodiment of the present disclosure.
Figure 9:
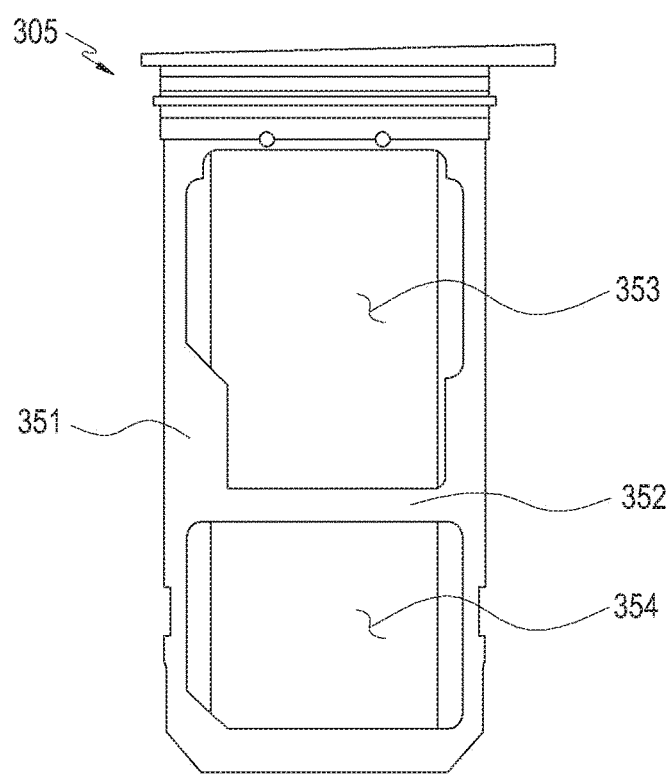
FIG. 9 is a plan view of the tray structure illustrated in FIG. 8 according to an embodiment of the present disclosure.

FIG. 8 is a perspective view of the tray structure of the electronic device illustrated in FIG. 5 according to an embodiment of the present disclosure. FIG. 9 is a plan view of the tray structure illustrated in FIG. 8 according to an embodiment of the present disclosure.

Referring to FIGS. 8 and 9, the tray structure 305 may have a receiving part 351 that receives a storage medium. The tray structure 305 may receive at least one of the memory card and the SIM card. The receiving part 351, according to various embodiments of the present disclosure, may have a first receiving space 353 in which a first storage medium is received, a second receiving space 354 in which a second storage medium is received, and a partition portion 352 that separates the first receiving space 353 and the second receiving space 354. Here, the first storage medium may be a memory card, and the second storage medium may be a SIM card. In contrast, the first storage medium may be a SIM card, and the second storage medium may be a memory card. Alternatively, the first and second storage mediums may be memory cards. The first storage medium and the second storage medium may both be received in the tray structure 305 so that the first and second storage mediums may be simultaneously used. Even though only one of the first and second storage mediums is received in the tray structure 305, it may be used. Further, a tray hole 356 corresponding to the second opening 312 may be formed in one end 355 of the tray structure 305.

Figure 10:
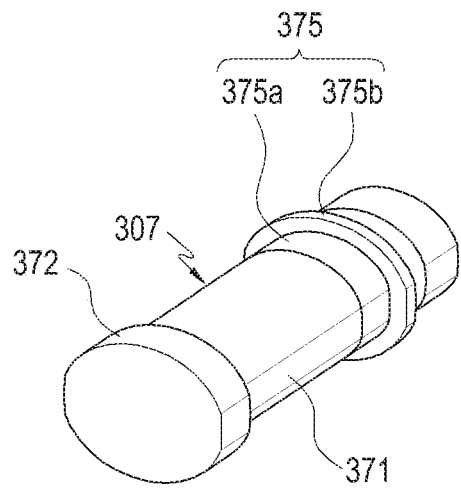
FIG. 10 is a perspective view of a sealing member of the electronic device illustrated in FIG. 5 according to an embodiment of the present disclosure.
Figure 11:
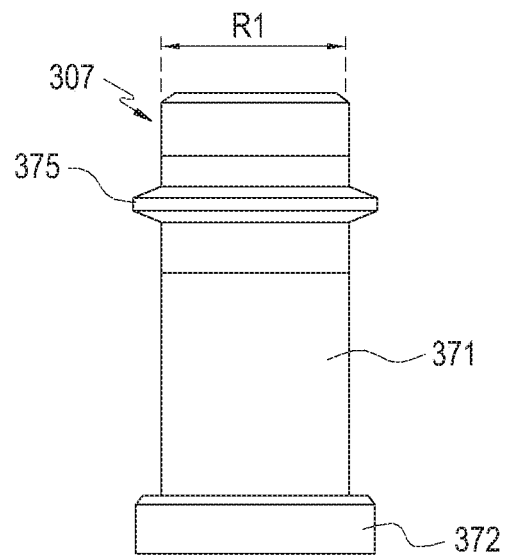
FIG. 11 is a side view of the sealing member illustrated in FIG. 10 according to an embodiment of the present disclosure.
Figure 12:
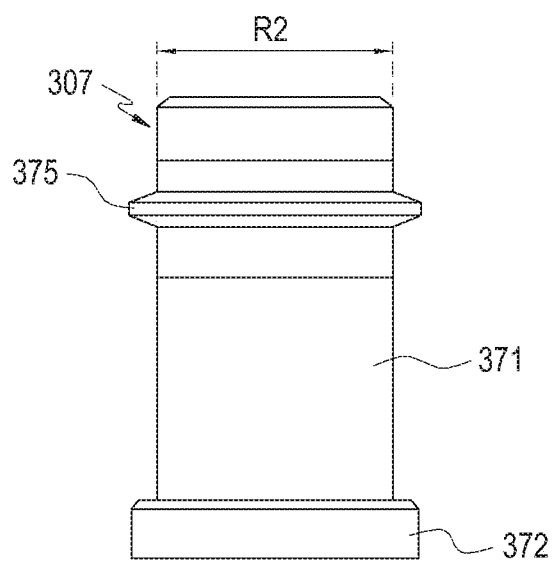
FIG. 12 is a side view of the sealing member illustrated in FIG. 10, which is viewed in a different direction according to an embodiment of the present disclosure.

FIG. 10 is a perspective view of the sealing member of the electronic device illustrated in FIG. 5 according to an embodiment of the present disclosure. FIG. 11 is a side view of the sealing member illustrated in FIG. 10 according to an embodiment of the present disclosure. FIG. 12 is a side view of the sealing member illustrated in FIG. 10, which is viewed in a different direction according to an embodiment of the present disclosure.

Referring to FIGS. 10 to 12, the sealing member 307 may include a first portion 371 that is inserted into the second opening 312 (illustrated in FIG. 5), a second end portion 372 that extends from one end of the first portion 371, and a protrusion 375 that protrudes along the outer circumferential surface of the first portion.

The first portion 371 may be formed of a plastic or metal material. The first portion 371 may have an outer surface groove formed along the outer circumferential surface thereof, and first protrusion 375a of the protrusion 375 may be accommodated in the outer surface groove. The first portion 371 may have an oval cross-section with the major axis diameter R2 that is larger than the minor axis diameter R1. Since the first portion 371 has an oval cross-section, it is possible to prevent the first portion 371 from rotating about its axis while the first portion 371 has been inserted into the second opening 312 (illustrated in FIG. 5). Without being limited thereto, however, the first portion 371 may have a circular or polygonal cross-section.

The sealing member 307 may include a first end portion and a second end portion. The first end portion may make contact with the second member by the press of the external member, and the second end portion 372 may be pressed by the external member.

The second end portion 372 may have an outer diameter that is larger than the inner diameter of the second opening 312 (illustrated in FIG. 5) so that the second end portion 372 may be stopped by the inside end of the second opening 312 (illustrated in FIG. 5). Namely, the second end portion 372 may prevent the first portion 371 from deviating from the bezel 301a through the second opening 312 (illustrated in FIG. 5).

The protrusion 375 may be formed of silicone. Without being limited thereto, however, the protrusion 375 may be formed of various resilient materials. The protrusion 375 may include: the first protrusion 375a that is accommodated in the outer surface groove so as to be coupled to the first portion; and the second protrusion 375b that protrudes from the first protrusion 375a. The first protrusion 375a may be attached to the outer surface groove by an adhesive, or may be coupled to the first portion 371 through insert-molding. The second protrusion 375b may be integrally formed with the first protrusion 375a.

A process of assembling the elements of the electronic device, according to various embodiments of the present disclosure, will be described with reference to FIGS. 13 to 17.

Figure 13:
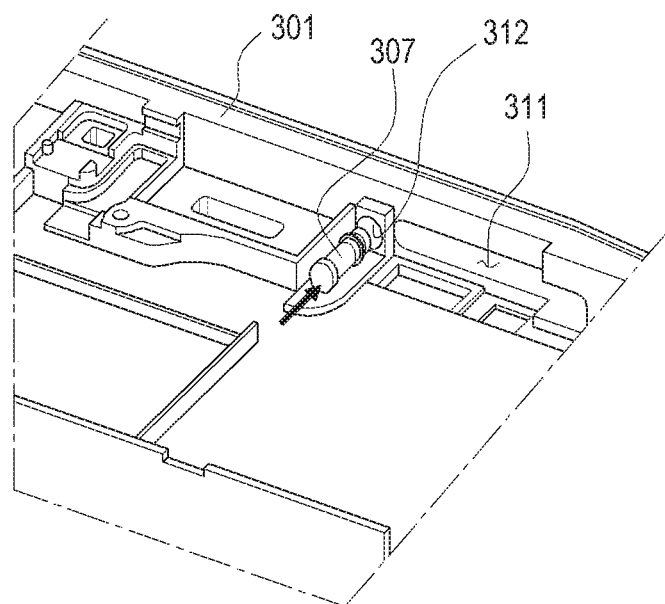
FIG. 13 is a perspective view illustrating a state before the sealing member of the electronic device illustrated in FIG. 5 is assembled in the second opening according to an embodiment of the present disclosure.

FIG. 13 is a perspective view illustrating a state before the sealing member of the electronic device illustrated in FIG. 5 is assembled in the second opening according to an embodiment of the present disclosure.

Referring to FIG. 13, the sealing member 307 may be inserted into the second opening 312 in the direction from the inside to the outside of the housing 301. At this time, the second end portion 372 (illustrated in FIG. 12) may be stopped by the inside end of the second opening 312.

Figure 14:
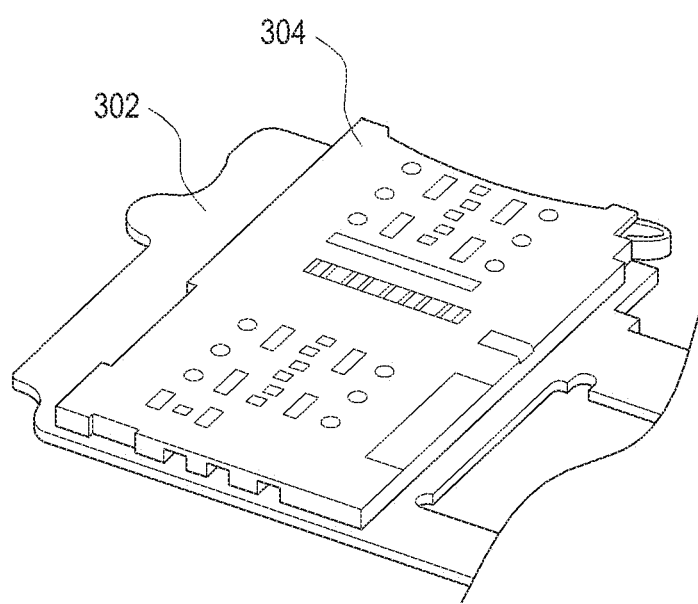
FIG. 14 is a perspective view illustrating the first member and the circuit board of the electronic device illustrated in FIG. 5 according to an embodiment of the present disclosure.
Figure 15:
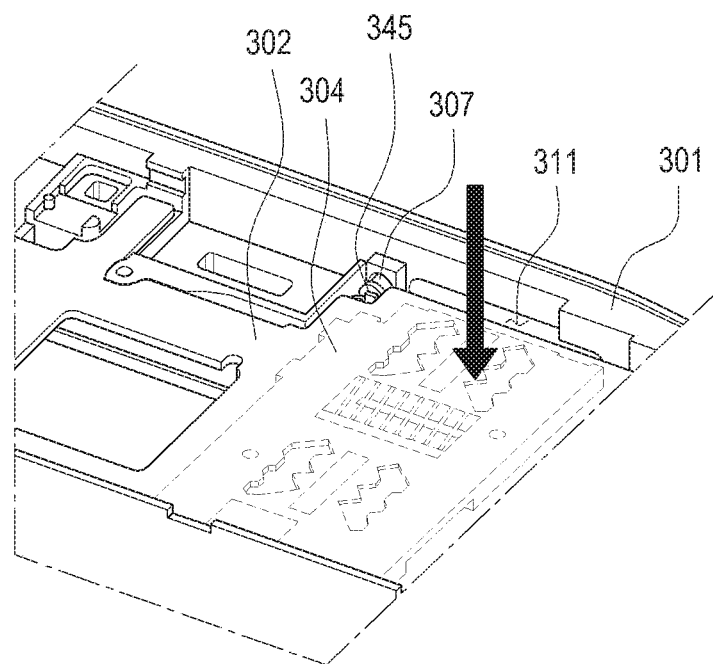
FIG. 15 is a perspective view illustrating a state in which the first member and the circuit board, illustrated in FIG. 14, have been mounted in the housing according to an embodiment of the present disclosure.

FIG. 14 is a perspective view illustrating the first member and the circuit board of the electronic device illustrated in FIG. 5 according to an embodiment of the present disclosure. FIG. 15 is a perspective view illustrating a state in which the first member and the circuit board, illustrated in FIG. 14, have been mounted in the housing according to an embodiment of the present disclosure.

Referring to FIGS. 14 and 15, the first member 304 may be mounted on the circuit board 302 and may be electrically connected with the circuit board 302. The first member 304, together with the circuit board 302, may be disposed on the inner surface of the housing 301. The first member 304 may be disposed in a position that corresponds to the first opening 311, and the second member 345 may be arranged in the same direction as the longitudinal direction of the sealing member 307.

Figure 16:
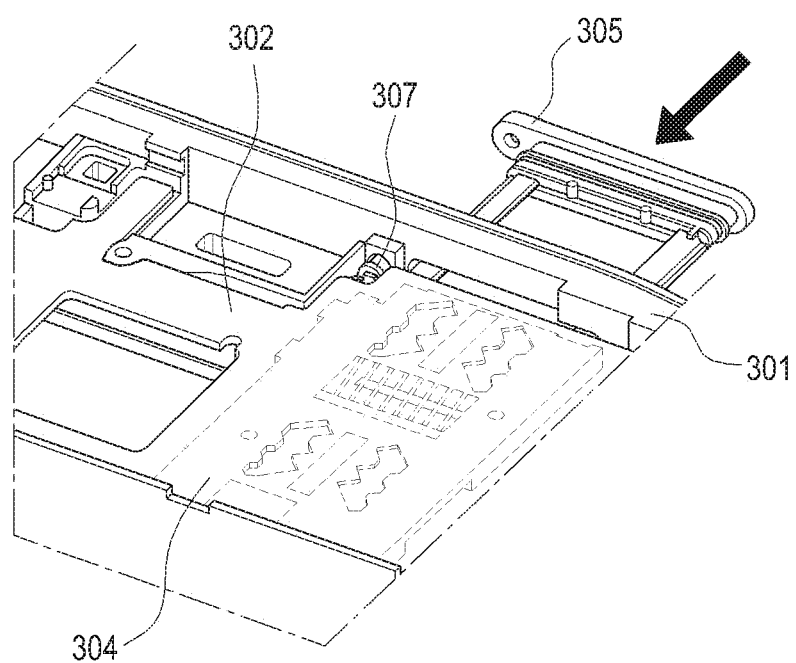
FIG. 16 is a perspective view illustrating a state before the tray structure is received in the first member illustrated in FIG. 14 according to an embodiment of the present disclosure.
Figure 17:
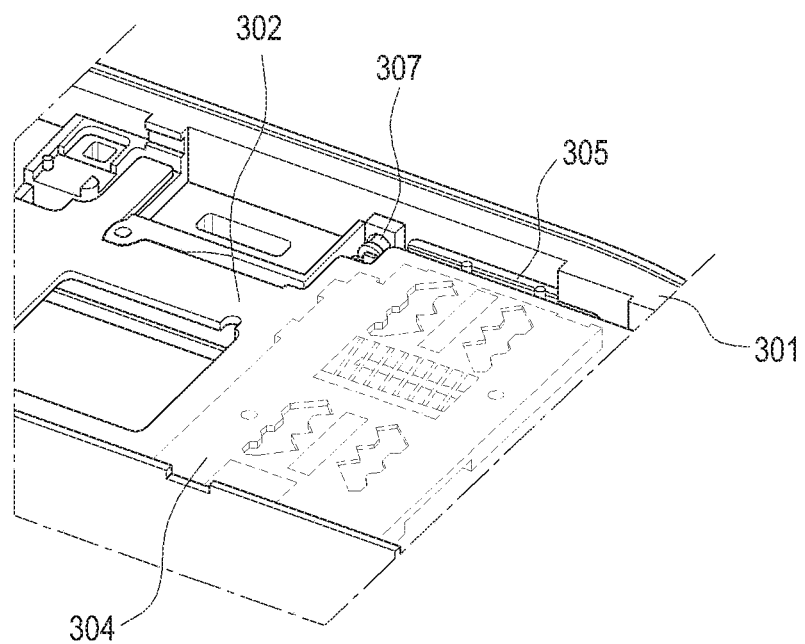
FIG. 17 is a perspective view illustrating a state after the tray structure is received in the first member illustrated in FIG. 14 according to an embodiment of the present disclosure.

FIG. 16 is a perspective view illustrating a state before the tray structure is received in the first member illustrated in FIG. 14 according to an embodiment of the present disclosure. FIG. 17 is a perspective view illustrating a state after the tray structure is received in the first member illustrated in FIG. 14 according to an embodiment of the present disclosure.

Referring to FIGS. 16 and 17, the tray structure 305 may be mounted in the first member 304 through the first opening 311. After the tray structure 305 is completely mounted in the first member 304, the storage medium received in the tray structure 305 may be electrically connected with the first member 304. Accordingly, the storage medium may be electrically connected with the circuit board 302.

Figure 18:
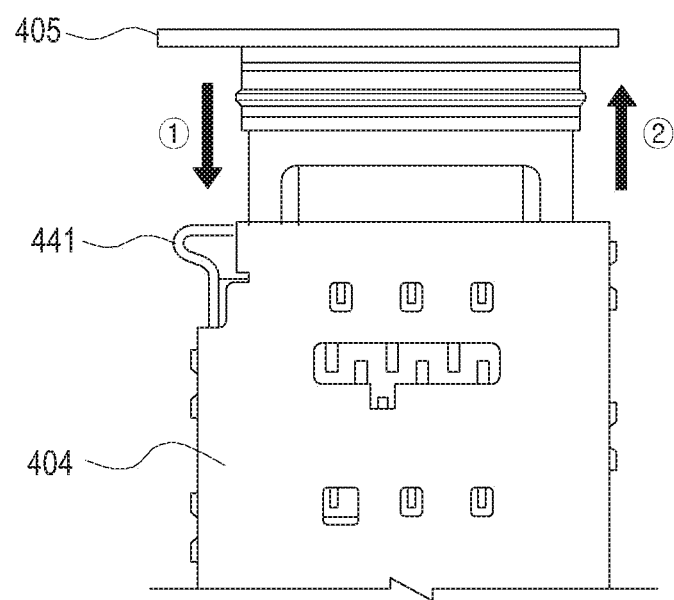
FIG. 18 is a plan view illustrating a first member and a tray structure of an electronic device according to an embodiment of the present disclosure.

FIG. 18 is a plan view illustrating a first member and a tray structure of an electronic device according to an embodiment of the present disclosure. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

Referring to FIG. 18, the electronic device, according to the embodiment of the present disclosure, may include the tray structure 405, the first member 404, and the second member 441. Hereinafter, a process of extracting the tray structure 405 from the first member 404 will be described.

When the second member 441 is pressed by the external member in the first direction ① in a state in which the tray structure 405 has been mounted in the first member 404, the second member 441 may move in the first direction ①, and at this time, a part of the second member 441 may apply a force to the tray structure 405 in the second direction ② that is opposite to the first direction ①. Accordingly, the tray structure 405 may be extracted from the first member 404 in the second direction ②.

Figure 19:
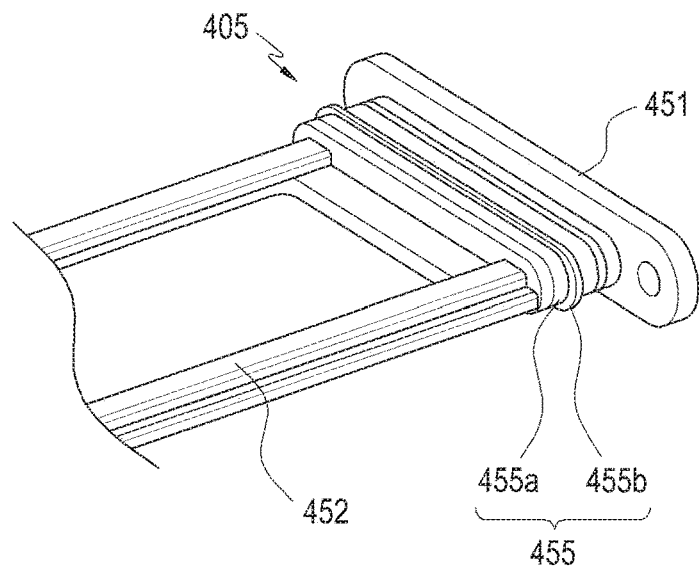
FIG. 19 is a perspective view of the tray structure illustrated in FIG. 18 according to an embodiment of the present disclosure.
Figure 20:
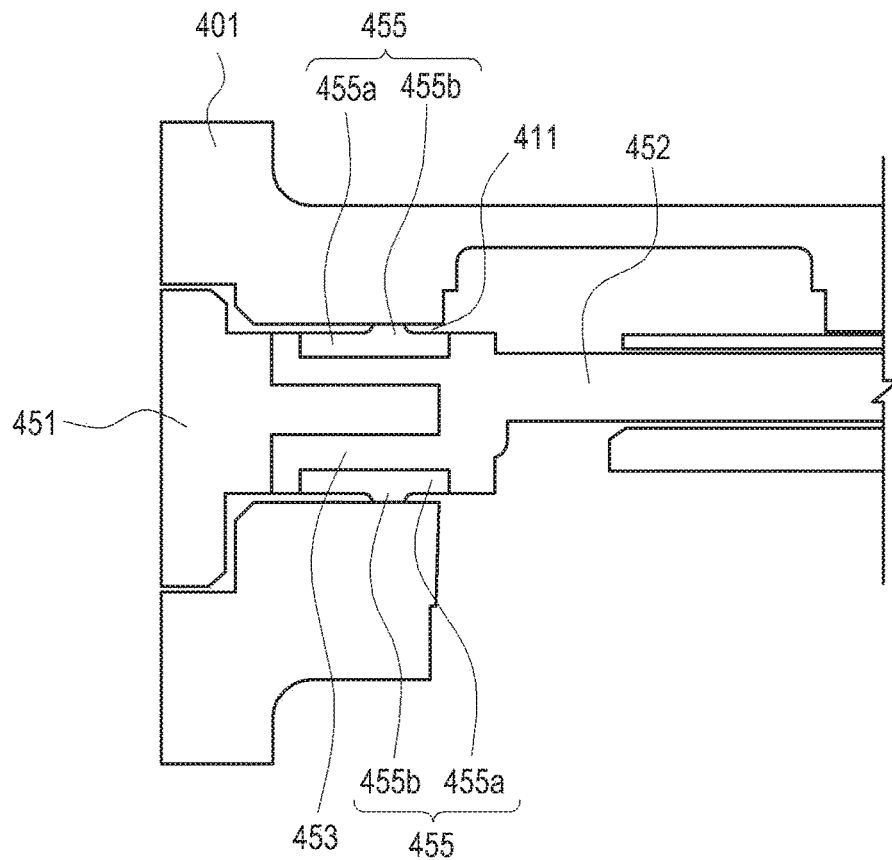
FIG. 20 is a sectional view illustrating a state in which the tray structure illustrated in FIG. 18 has been accommodated in a bezel according to an embodiment of the present disclosure.
Figure 21:
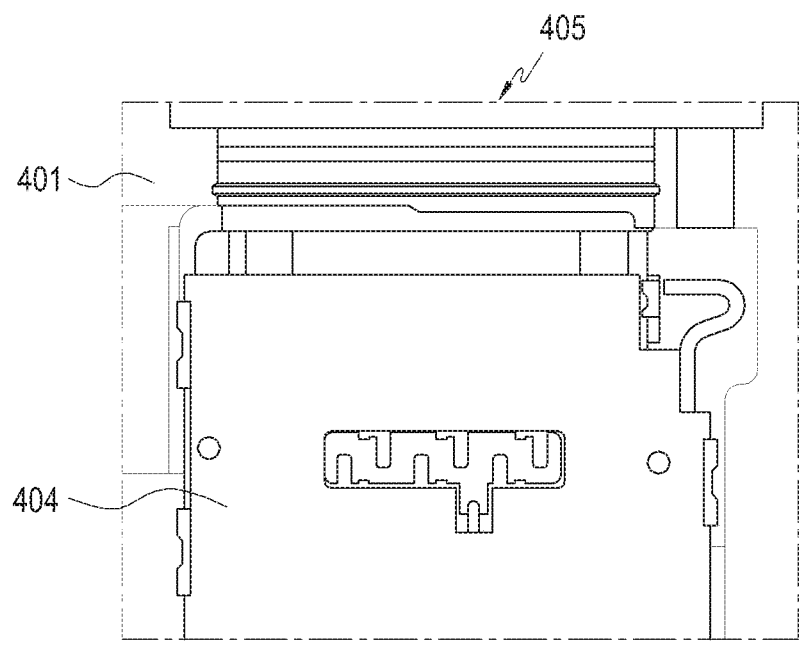
FIG. 21 is a plan view illustrating the state in which the tray structure illustrated in FIG. 18 has been accommodated in the bezel according to an embodiment of the present disclosure.

FIG. 19 is a perspective view of the tray structure illustrated in FIG. 18 according to an embodiment of the present disclosure. FIG. 20 is a sectional view illustrating a state in which the tray structure illustrated in FIG. 18 has been accommodated in a housing according to an embodiment of the present disclosure. FIG. 21 is a plan view illustrating the state in which the tray structure illustrated in FIG. 18 has been accommodated in the housing according to an embodiment of the present disclosure.

Referring to FIGS. 19 to 21, the tray structure 405 may include a receiving part 452 that receives a storage medium, an extension 453 that extends from the receiving part 452, and a tray waterproofing member 455 that protrudes from the extension 453.

The extension 453 may be provided between the receiving part 452 and one end 451 of the tray structure. The extension 453 may have a tray groove formed along the outer surface of the extension.

The tray waterproofing member 455 may include a first tray waterproofing member 455a that is formed of silicone and is accommodated in the tray groove and a second tray waterproofing member 455b that protrudes from the first tray waterproofing member 455a. The first tray waterproofing member 455a may be attached to the tray groove by an adhesive, or may be coupled to the extension 453 through insert-molding. The tray structure 405 may be inserted into the housing 401 through the first opening 411, and the second tray waterproofing member 455b may be brought close to the inner wall of the first opening 411 to prevent foreign substances (such as water, etc.) from being introduced from the outside through the first opening 411.

The end 451 of the tray structure may be coupled with the extension 453. The end 451 of the tray structure may be formed of a metal material to harmonize with the external appearance of the housing 401 that is formed of a metal material. The end 451 of the tray structure, which is formed of a metal material, may be used as an antenna radiator of the electronic device. Without being limited thereto, however, the end 451 of the tray structure may be formed of various types of materials, such as plastics, etc. The receiving part 452 and the extension 453 may be formed of a metal material so as to be used as an antenna radiator together with the end 451 of the tray structure. Without being limited thereto, however, the receiving part 452 and the extension 453 may be formed of various types of materials, such as plastics, etc.

Figure 22:
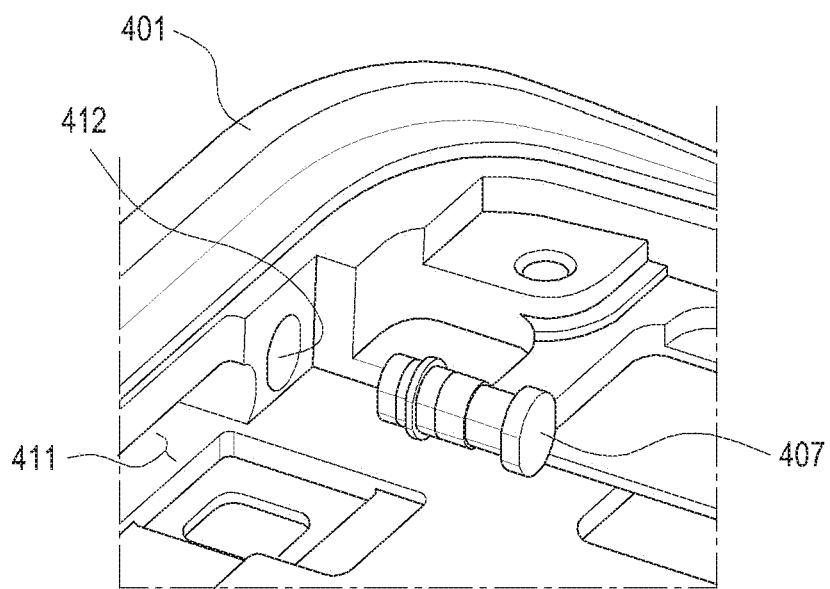
FIG. 22 is a perspective view illustrating a state in which a sealing member is assembled in a second opening of the electronic device illustrated in FIG. 18 according to an embodiment of the present disclosure.
Figure 23:
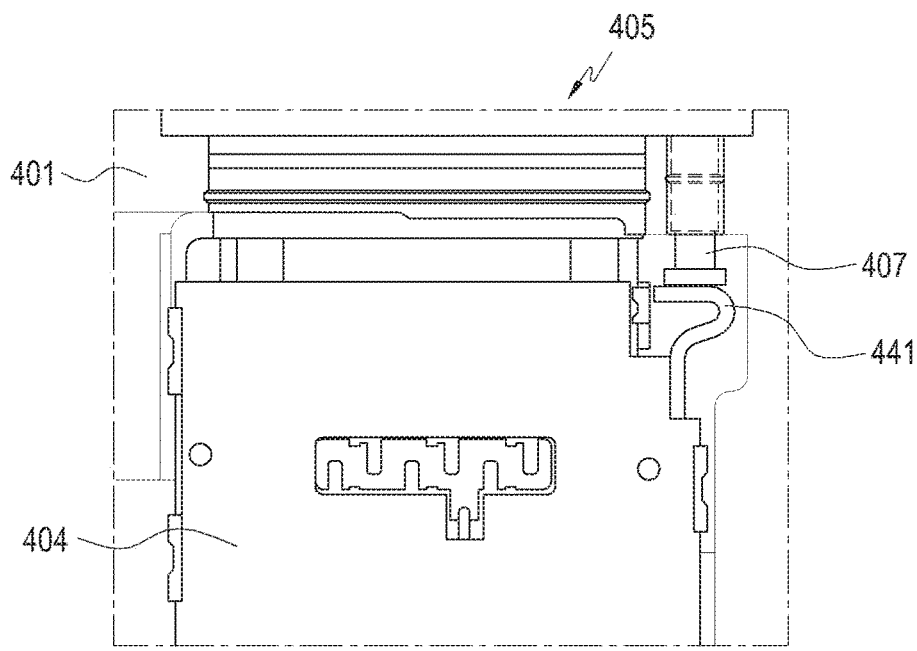
FIG. 23 is a perspective view illustrating a state in which the sealing member has been inserted into the second opening of the electronic device illustrated in FIG. 22 according to an embodiment of the present disclosure.
Figure 24:
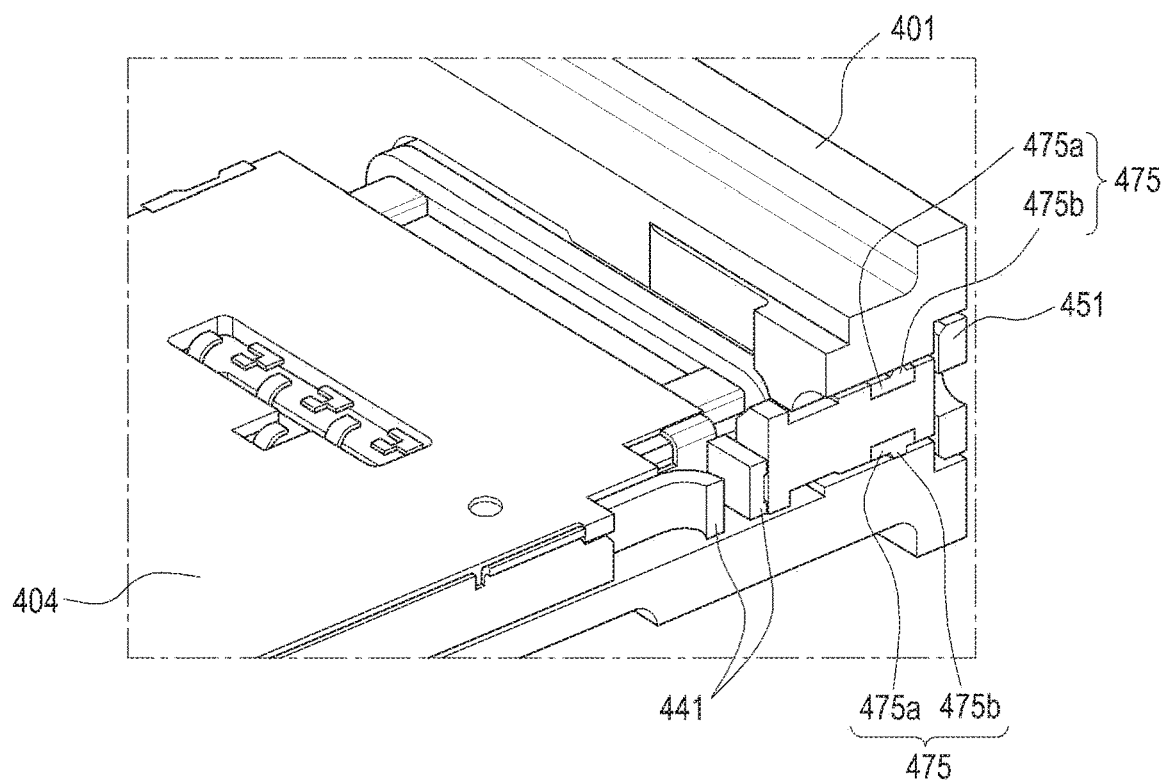
FIG. 24 is a partially cutaway perspective view illustrating the state in which the sealing member has been inserted into the second opening of the electronic device illustrated in FIG. 22 according to an embodiment of the present disclosure.
Figure 25:
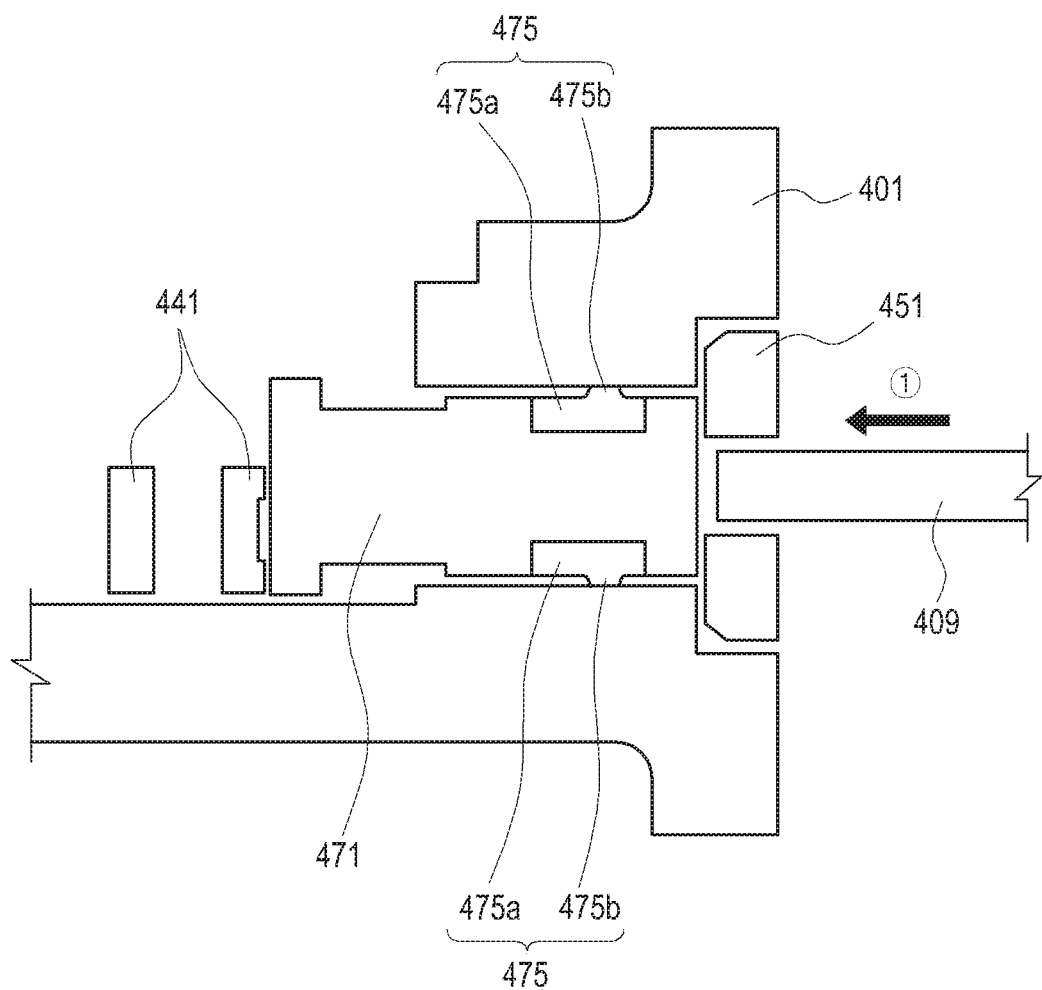
FIG. 25 is a sectional view illustrating the state in which the sealing member has been inserted into the second opening of the electronic device illustrated in FIG. 22 according to an embodiment of the present disclosure.
Figure 26:
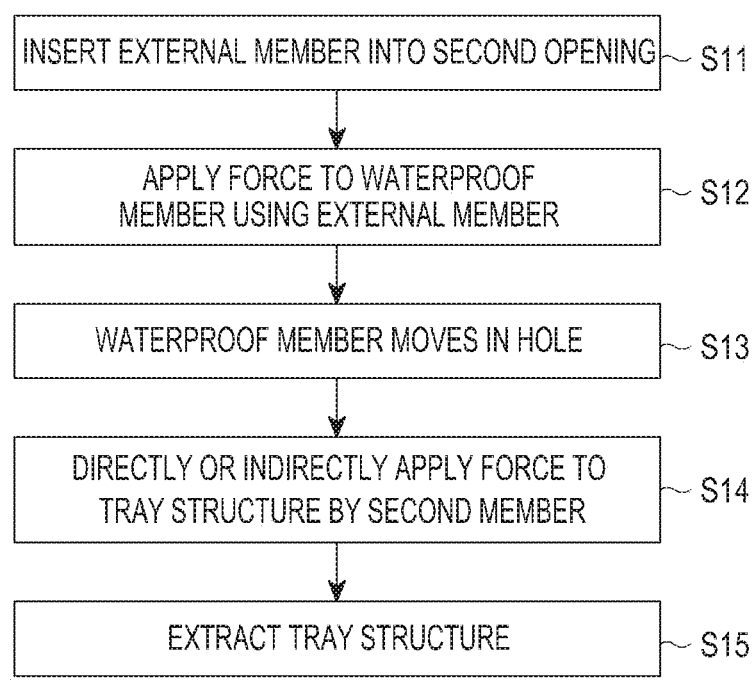
FIG. 26 is a flowchart illustrating a process of extracting the tray structure of the electronic device from the bezel according to an embodiment of the present disclosure.

FIG. 22 is a perspective view illustrating a state in which a sealing member is assembled in the second opening of the electronic device illustrated in FIG. 18 according to an embodiment of the present disclosure. FIG. 23 is a perspective view illustrating a state in which the sealing member has been inserted into the second opening of the electronic device illustrated in FIG. 22 according to an embodiment of the present disclosure. FIG. 24 is a partially cutaway perspective view illustrating the state in which the sealing member has been inserted into the second opening of the electronic device illustrated in FIG. 22 according to an embodiment of the present disclosure. FIG. 25 is a sectional view illustrating the state in which the sealing member has been inserted into the second opening of the electronic device illustrated in FIG. 22 according to an embodiment of the present disclosure. FIG. 26 is a flowchart illustrating a process of extracting the tray structure of the electronic device from the housing according to an embodiment of the present disclosure.

Referring to FIGS. 22 to 26, the sealing member 407 may be inserted into the second opening 412 and may be brought close to a part of the second opening 412. The sealing member 407 may include a first portion 471 and a protrusion 475. The first portion 471 may have an outer surface groove formed along the outer circumferential surface thereof, and a part 475*a* of the protrusion may be accommodated in the outer surface groove. The protrusion 475 may include a first protrusion 475*a* that is accommodated in the outer surface groove and a second protrusion 475*b* that protrudes from the first protrusion 475*a*. The second protrusion 475*b* may be brought close to the inner wall of the second opening 412 to prevent foreign substances (such as water, etc.) from being introduced into the housing 401 from the outside through the second opening 412.

A method S10 of extracting the tray structure of the electronic device from the housing, according to various embodiments of the present disclosure, may include: inserting an external member 409 into the second opening 412 in operation S11; applying a force to the sealing member 407 using the external member 409 in operation S11; moving the sealing member 407 in the second opening in operation S12; applying a force to the second member 441 by the sealing member 407 in operation S13; directly or indirectly applying a force to the tray structure 405 by the second member 411 in operation S14; and extracting the tray structure 405 from the housing 401 in operation S15.

In operation S11 of inserting the external member 409 into the second opening 412, the external member 409 may be inserted into the second opening 412 through a tray hole that is formed in one end 451 of the tray structure.

In operation S11 of applying a force to the sealing member 407 using the external member 409, the external member 409 may apply a force to the waterproofing structure 475 in a first direction ①.

In operation S12 in which the sealing member 407 moves in the second opening, the second protrusion 475*b* may move while making close contact with the inner wall of the second opening 412. Even though the second protrusion 475*b* moves while making close contact with the inner wall of the second opening 412, the second protrusion 475*b*, which is integrally formed with the first protrusion 475*a*, may be firmly coupled to the first portion 471 without deviating from the outer surface groove.

In operation S13 in which the sealing member 407 applies a force to the second member 441, the sealing member 407 may transmit the force, which is transmitted from the external member 409, to the second member 441.

In operation S14 in which the second member 441 applies a force to the tray structure 405, the second member 441, which has received the force from the sealing member 407, may apply a force to the tray structure 405 in the second direction that is opposite to the first direction (e.g., in the direction toward the outside of the housing 410). Further, according to various embodiments of the present disclosure, the second member 441 may indirectly apply a force to the tray structure 405 through a medium (e.g., a rotary part to be described below) between the second member 441 and the tray structure 405 without being limited to directly applying a force to the tray structure 405.

In operation S15 of extracting the tray structure 405 from the housing 401, the tray structure 405, which has received the force from the second member 441, may be extracted in the second direction.

As described above, according to the various embodiments of the present disclosure, the sealing member 407 of the electronic device may seal the second opening 412 to prevent foreign substances from being introduced from the outside. In addition, the sealing member 407 may transmit the force by which the tray structure 405 is extracted from the housing 401 while moving through the second opening 412.

Figure 27:
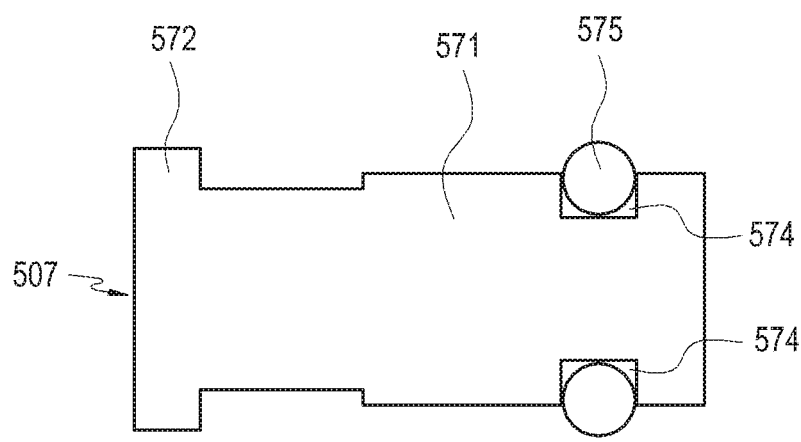
FIG. 27 is a sectional view of a sealing member of an electronic device according to an embodiment of the present disclosure.
Figure 28:
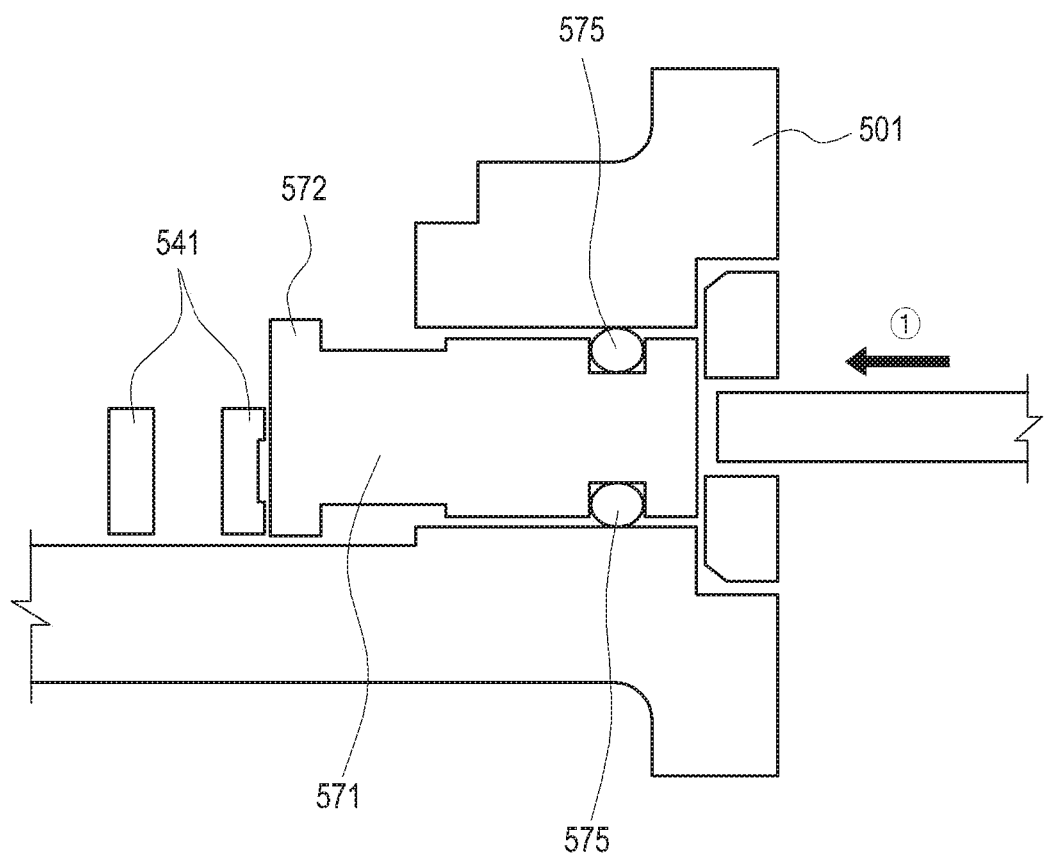
FIG. 28 is a sectional view illustrating a state in which the sealing member illustrated in FIG. 27 has been inserted into a second opening according to an embodiment of the present disclosure.

FIG. 27 is a sectional view of a waterproof structure of an electronic device according to an embodiment of the present disclosure. FIG. 28 is a sectional view illustrating a state in which the waterproof structure illustrated in FIG. 27 has been inserted into a second opening according to an embodiment of the present disclosure.

Referring to FIGS. 27 and 28, the electronic device, according to the embodiment of the present disclosure, may include a housing 501, the waterproof structure 507, and a second member 541. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

The waterproof structure 507 may include a first portion 571 having an outer surface groove 574, a second end portion 572, and a ring 575.

The ring 575 may be formed of silicone. Further, the ring 575 may have a circular cross-section. While the waterproof structure 507 has been inserted into the second opening, the ring 575 may be brought close to the inner wall of the second opening to prevent foreign substances from being introduced into the housing 501 through the second opening.

Figure 29:
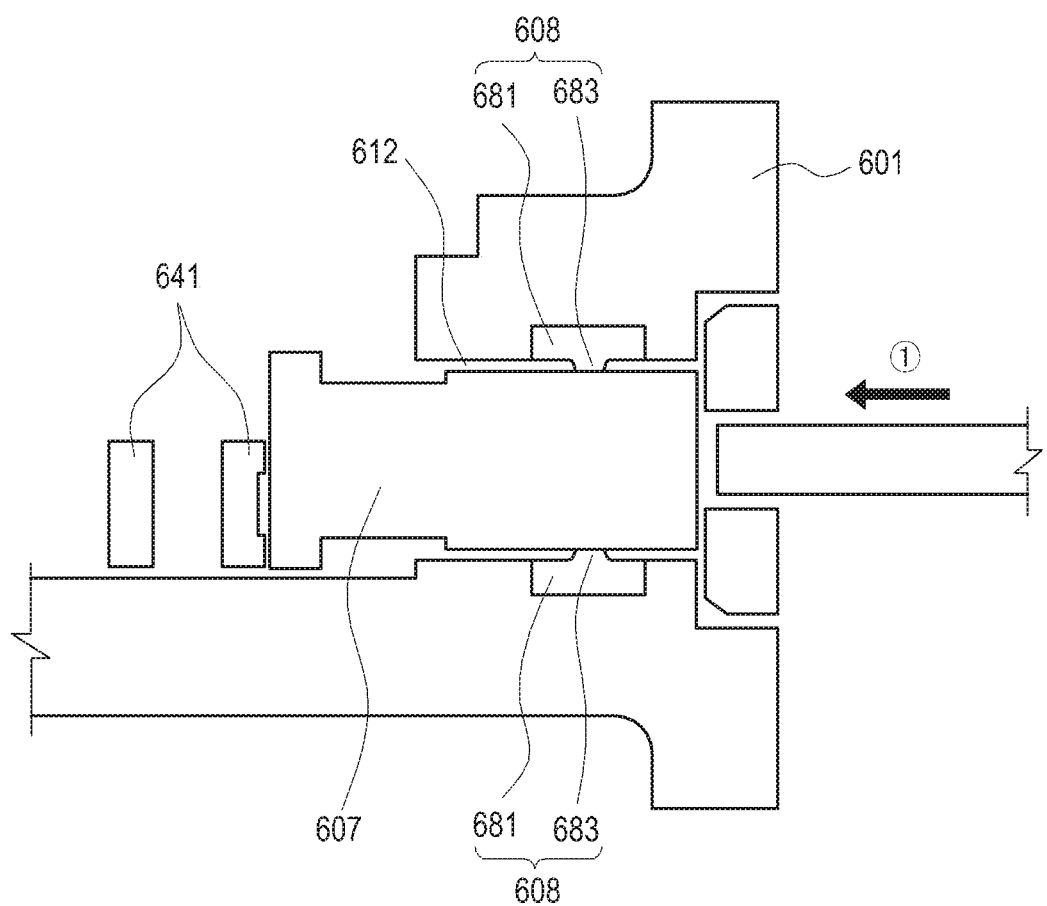
FIG. 29 is a sectional view illustrating a sealing member of an electronic device according to an embodiment of the present disclosure.

FIG. 29 is a sectional view illustrating a waterproof structure of an electronic device according to an embodiment of the present disclosure.

Referring to FIG. 29, the electronic device, according to the embodiment of the present disclosure, may include a bezel 601, a pin 607, a second member 641, and the waterproof structure 608. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

The pin 607 may be inserted into a second opening 612 to transmit an external force, which is transmitted thereto in a first direction ①, to the second member 641.

The waterproof structure 608 may be provided on the inner wall of the second opening 612. A groove may be formed in the inner wall of the second opening 612, and a first waterproof structure 681 of the waterproof structure 608 may be accommodated in the groove. The waterproof structure 608 may include a first waterproof structure 681 that is accommodated in the groove and is coupled to the inner wall of the second opening 612 and a second waterproof structure 683 that protrudes from the first waterproof structure 681. The second waterproof structure 683 may be integrally formed with the first waterproof structure 681 and may be brought close to the outer circumferential surface of the pin 607.

Figure 30:
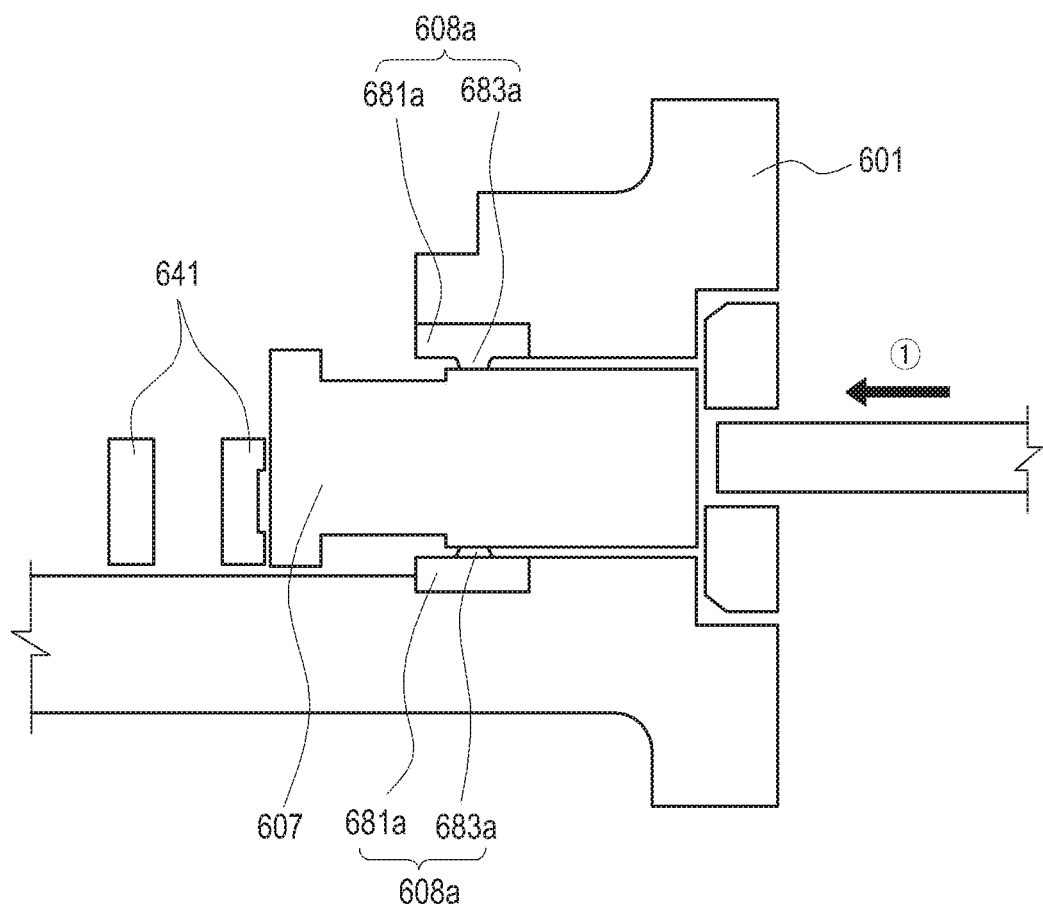
FIG. 30 is a sectional view illustrating a sealing member of an electronic device according to an embodiment of the present disclosure.

FIG. 30 is a sectional view illustrating a waterproof structure of an electronic device according to an embodiment of the present disclosure. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

Referring to FIG. 30, the waterproof structure 608a of the electronic device, according to the embodiment of the present disclosure, may include a first waterproof structure 681a and a second waterproof structure 683a, and may be provided on an inside end of the second opening 612. Since the waterproof structure 608 is provided on the inside end of the second opening 612, it is possible to easily form a groove for receiving the first waterproof structure 681a.

Figure 31:
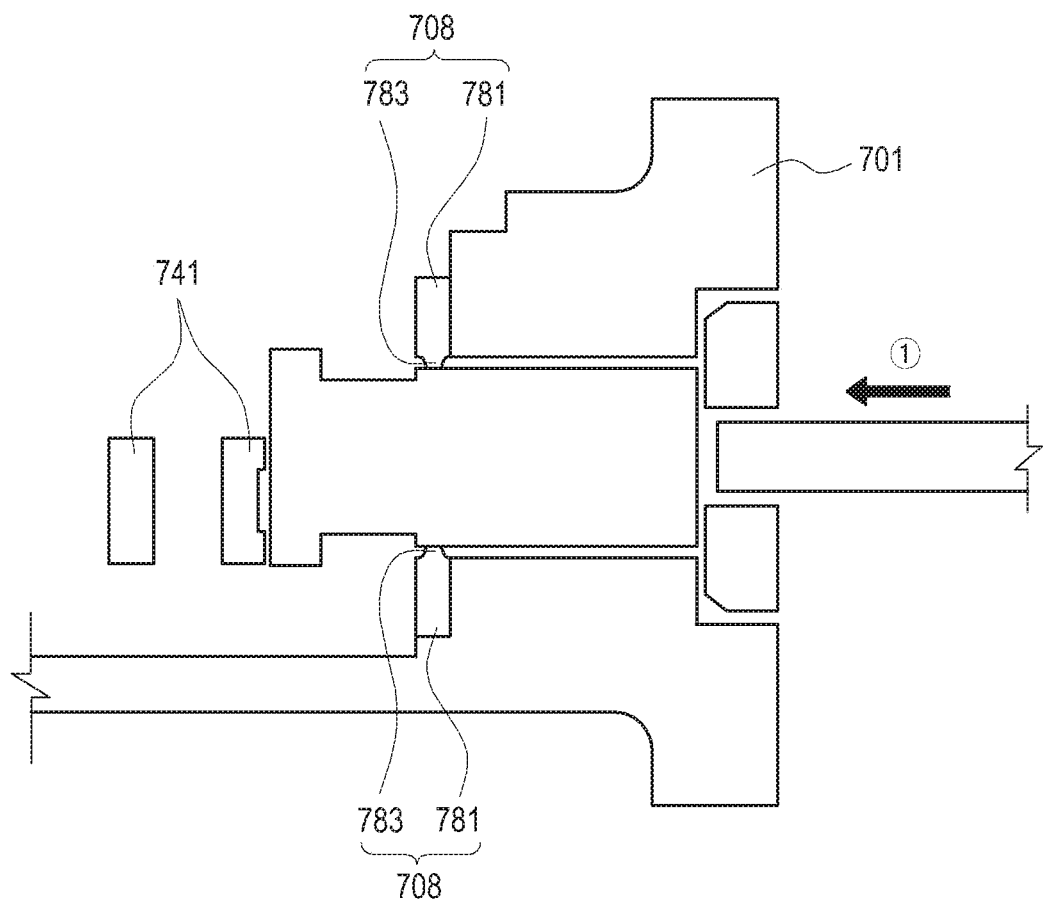
FIG. 31 is a sectional view illustrating a sealing member of an electronic device according to an embodiment of the present disclosure.

FIG. 31 is a sectional view illustrating a waterproof structure of an electronic device according to an embodiment of the present disclosure. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

Referring to FIG. 31, the electronic device, according to the embodiment of the present disclosure, may include a housing 701, a pin 707, a second member 741, and the waterproof structure 708.

The waterproof structure 708 may be provided adjacent to the inner wall of a second opening. The waterproof structure 708 may include a first waterproof structure 781 that is attached to the entrance of the second opening and a second waterproof structure 783 that protrudes from the first waterproof structure 781. The second waterproof structure 783 may be brought close to the outer circumferential surface of the pin 707 to prevent foreign substances from being introduced into the housing 701 through the second opening. As described above, the waterproof structure 708 of the electronic device, according to the embodiment of the present disclosure, is provided outside the second opening, which makes it possible to easily replace the waterproof structure 708 when the waterproof structure is damaged.

Figure 32:
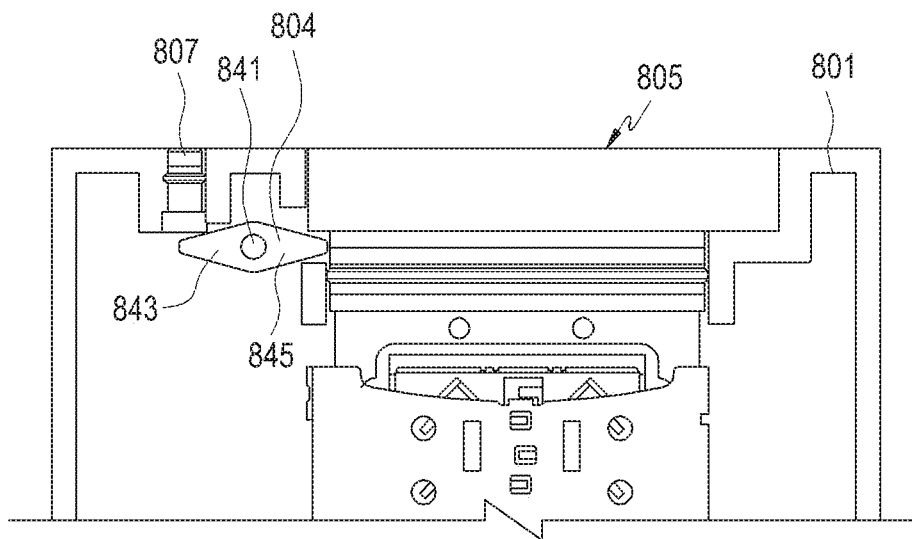
FIG. 32 is a plan view illustrating a rotary part of an electronic device according to an embodiment of the present disclosure.
Figure 33:
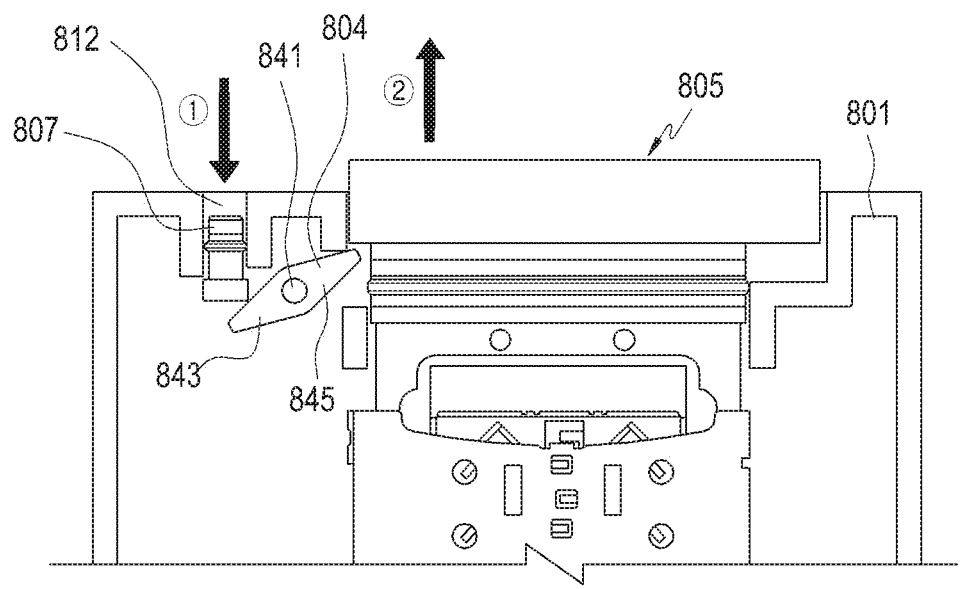
FIG. 33 is a plan view illustrating a state in which a tray structure is extracted by the rotation of the rotary part illustrated in FIG. 32 according to an embodiment of the present disclosure.

FIG. 32 is a plan view illustrating a rotary part of an electronic device according to an embodiment of the present disclosure. FIG. 33 is a plan view illustrating a state in which a tray structure is extracted by the rotation of the rotary part illustrated in FIG. 32 according to an embodiment of the present disclosure. In the description of this embodiment, elements that are similar to those in the preceding embodiment and/or elements that can be easily understood through the preceding embodiment may be provided with identical reference numerals, or the reference numerals may be omitted. Also, detailed descriptions thereof will be omitted.

Referring to FIGS. 32 and 33, the electronic device, according to the embodiment of the present disclosure, may include a housing 801 having a first opening, the tray structure 805, a waterproof structure 807, and the rotary part 804.

The waterproof structure 807 may be provided in a second opening 812 formed in the housing 801 to seal a part of the second opening 812.

The rotary part 804 may be disposed between the second opening 812 and the first opening. The rotary part 804 may include: a first rotary part 843 that makes contact with the waterproof structure 807; a second rotary part 845 that is connected with the first rotary part 843 and makes contact with one end of the tray structure 805; and a third rotary part 841 disposed between the first rotary part 843 and the second rotary part 845. The third rotary part 841 may be rotatably coupled to the housing 801, and the first and second rotary parts 843 and 845 may rotate about the third rotary part 841.

When an external member (not illustrated) is inserted into the second opening 812 in a first direction ①, the external member may press the waterproof structure 807 so that the waterproof structure 807 may move in the second opening 812. Further, the waterproof structure 807 may apply a force to the first rotary part 843 to rotate the first rotary part 843 about the third rotary part 841. At this time, the second rotary part 845 may apply a force to one end of the tray structure 805 so that the tray structure 805 may move in a second direction ②.

As described above, a portable electronic device, according to various embodiments of the present disclosure, may include: a front glass cover that forms the front of the electronic device; a back cover that forms the back of the electronic device; a bezel that surrounds the space formed between the front and back covers and is formed integrally with, or separately from, the back cover, wherein the bezel has a first opening with a first size and a second opening with a second size smaller than the first size, the second opening being disposed adjacent to the first opening; a display device that is located in the space and has a screen area exposed through the front cover; a tray structure that is inserted into the space through the first opening and is detachably mounted, the tray structure having a recess in which a memory card and/or a SIM card is received; a first member that holds the tray structure when the tray structure is inserted into the space and a second member that allows a first member to release the tray structure by the press of an external member that is inserted through the second opening; and a waterproof structure that includes a first portion that is movably inserted into the second opening, a first end portion that makes contact with the second member by the press of the external member, and a second end portion that is pressed by the external member.

The portable electronic device, according to various embodiments of the present disclosure, may further include a ring that hermetically seals the space between the inner surface of the second opening and the first portion.

According to various embodiments of the present disclosure, the waterproof structure may further include a protrusion that protrudes along the outer circumferential surface of the first portion to seal a part of the second opening.

According to various embodiments of the present disclosure, the protrusion may be formed of silicone.

According to various embodiments of the present disclosure, the first portion may have an outer surface groove formed along the outer circumferential surface thereof, and a part of the protrusion may be accommodated in the outer surface groove.

According to various embodiments of the present disclosure, the portable electronic device may further include a rotary part disposed between the second opening and the first opening, wherein the waterproof structure may move in the longitudinal direction of the second opening by an external force to transmit, to the rotary part, a force that extracts the tray structure from the bezel, and the rotary part may extract the tray structure from the bezel by pushing one end of the tray structure while rotating.

According to various embodiments of the present disclosure, the rotary part may include: a first rotary part that makes contact with the waterproof structure; a second rotary part that makes contact with one end of the tray structure; and a third rotary part that is disposed between the first rotary part and the second rotary part and is rotatably coupled to the bezel, and the second rotary part may extract the tray structure from the bezel while rotating about the third rotary part when the waterproof structure rotates the first rotary part according to the movement thereof.

According to various embodiments of the present disclosure, the tray structure may include: a receiving part that receives a storage medium; and a tray waterproofing member provided between the receiving part and one end of the tray structure, and the tray waterproofing member may be brought close to the inner wall of the first opening.

A portable electronic device, according to various embodiments of the present disclosure, may include: a housing having a first opening; a first member accommodated in the housing; a tray structure that receives a storage medium and is detachably coupled to the first member through the first opening; a second opening formed adjacent to the first opening; and a waterproof structure that moves in the second opening along the longitudinal direction of the second opening and seals a part of the second opening, and the tray structure may be extracted from the housing by the waterproof structure that moves in the second opening.

According to various embodiments of the present disclosure, the portable electronic device may further include a second member that transmits a force to extract the tray structure, which is mounted in the first member, from the housing.

According to various embodiments of the present disclosure, the waterproof structure may move in the longitudinal direction of the second opening by the press of the external member to transmit, to the second member, a force that extracts the tray structure from the housing.

According to various embodiments of the present disclosure, the waterproof structure may include a second end portion having an outer diameter that is larger than the inner diameter of the second opening, and the second end portion may be located between the inner wall of the housing and the second member and may be stopped by the inside end of the second opening to prevent the waterproof structure from being extracted from the housing through the second opening when the second member transmits a force to the second end portion.

A portable electronic device, according to various embodiments of the present disclosure, may include: a housing having a first opening; a first member accommodated in the housing; a tray structure that receives a storage medium and is detachably coupled to the first member through the first opening; a second opening that is formed in the housing and provides a passage through which an operation is performed such that the tray structure is extracted from the housing; a pin, at least a part of which is accommodated in the second opening; and a waterproof structure that is provided on the inner wall of the second opening, or is provided adjacent to the inner wall of the second opening, and is brought close to the pin.

According to various embodiments of the present disclosure, the waterproof structure may be provided on the inside end of the second opening.

According to various embodiments of the present disclosure, the waterproof structure may include: a first waterproof structure provided in a groove that is formed in the inner wall of the second opening; and a second waterproof structure that extends from the first waterproof structure and protrudes toward the pin.

According to various embodiments of the present disclosure, the second waterproof structure may be brought close to the outer circumferential surface of the pin.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:
1. A portable electronic device comprising:
a housing including a first opening formed through a side wall of the housing and a second opening formed through the side wall;
a tray structure detachably coupled to the housing through the first opening; and
a sealing member comprising:
an extending portion at least partially inserted into the second opening, the extending portion including a first end and a second end opposite to the first end;
at least one first sealing portion disposed on an outer periphery of the extending portion between the first end and the second end, the at least one first sealing portion configured to seal a gap between an inner periphery of the second opening and the outer periphery of the extending portion; and
a stopping portion formed at the second end and disposed in the housing,
wherein the stopping portion is configured to interfere with an inner surface of the side wall in order to prevent the extending portion from separating from the housing through the second opening.
2. The portable electronic device of claim 1, wherein the stopping portion has a diameter larger than a diameter of the second opening.
3. The portable electronic device of claim 1, wherein the stopping portion has a diameter larger than a diameter of the extending portion.

4. The portable electronic device of claim 1, wherein the stopping portion is configured to prevent the extending portion from separating from the housing through the second opening.

5. The portable electronic device of claim 1, further comprising:
a socket disposed in the housing corresponding to the first opening, the socket configured to receive a portion of the tray structure inserted into the housing through the first opening; and
a release disposed in the housing adjacent to the socket,
wherein the stopping portion is disposed between the inner surface of the side wall and the release while an end surface of the stopping portion corresponding to an end surface of the release, and
wherein an area of the end surface of the stopping portion is larger than an area of the end surface of the release.

6. A portable electronic device comprising:
a housing including a first opening formed through a side wall of the housing and a second opening formed through the side wall;
a tray structure detachably coupled to the housing through the first opening; and
a sealing member comprising:
an extending portion at least partially inserted into the second opening, the extending portion including a first end and a second end opposite to the first end;
a stopping portion formed at the second end and configured to prevent the extending portion from separating from the housing through the second opening; and
at least one first sealing portion disposed at least at a periphery of an end of the second opening at an inner surface of the side wall, the sealing member configured to seal the second opening with the extending portion at least partially inserted therein.

7. The portable electronic device of claim 6, wherein the second opening is smaller than the first opening.

8. The portable electronic device of claim 6, wherein the extending portion is configured to move along a longitudinal direction of the second opening.

9. The portable electronic device of claim 6, wherein the stopping portion has a diameter larger than a diameter of the extending portion.

10. The portable electronic device of claim 6, wherein the stopping portion is configured to interfere with the inner surface of the side wall in order to prevent the extending portion from separating from the housing through the second opening.

11. The portable electronic device of claim 6, wherein the at least one first sealing portion is configured to contact an outer surface of the extending portion between the first end and the second end to seal the second opening.

12. The portable electronic device of claim 6, wherein the at least one first sealing portion comprises:
an opening having a diameter smaller than a diameter of the end of the second opening at the inner surface of the side wall; and
a first portion beginning at the inner surface of the side wall and extending towards the opening.

13. The portable electronic device of claim 12, wherein the first portion is configured to contact an outer surface of the extending portion between the first end and the second end.

14. The portable electronic device of claim 12,
wherein the at least one first sealing portion is configured to have a first width along a direction perpendicular to a longitudinal direction of the second opening at the inner surface of the side wall and a second width at an extending end thereof towards the opening, and
wherein the second width is less than the first width.

15. The portable electronic device of claim 6, further comprising:
a socket disposed in the housing corresponding to the first opening, the socket configured to receive a portion of the tray structure inserted into the housing through the first opening; and
a release disposed in the housing adjacent to the socket while corresponding to the second opening,
wherein the stopping portion is disposed between the inner surface of the side wall and the release.

16. The portable electronic device of claim 15, wherein the sealing member is configured to press the release in response to an external force applied through the second opening to the first end.

17. The portable electronic device of claim 15, wherein the release is configured to release the tray structure received in the socket in response to a movement of the sealing member.

18. The portable electronic device of claim 17, wherein a tunnel in the side wall forms the second opening, the tunnel having a length corresponding at least to an amount of the movement of the sealing member to release the tray structure received in the socket.

19. The portable electronic device of claim 15, wherein a combined length of the extending portion and the stopping portion in a moving direction thereof is longer than a distance between the inner surface of the side wall and the release.

20. The portable electronic device of claim 6, wherein the tray structure comprises:
a receiving part configured to receive at least one storage medium and configured to be inserted in the housing through the first opening;
an extension extending between the receiving part and an end of the tray structure, the extension configured to be at least partially received in the first opening; and
at least one second sealing portion disposed on an outer surface of the extension and configured to seal the first opening,
wherein a portion of the at least one second sealing portion is configured to contact an inner surface of the first opening.

21. The portable electronic device of claim 1, wherein the stopping portion has a diameter larger than a maximum diameter of the extending portion.

* * * * *